(12) United States Patent
Kim et al.

(10) Patent No.: US 11,037,646 B2
(45) Date of Patent: Jun. 15, 2021

(54) MEMORY CONTROLLER, OPERATING METHOD OF MEMORY CONTROLLER AND MEMORY SYSTEM

(71) Applicant: SAMSUNG ELECTRONICS CO., LTD., Suwon-si (KR)

(72) Inventors: Minuk Kim, Hwaseong-si (KR); Bohwan Jun, Uijeongbu-si (KR); Hong Rak Son, Anyang-si (KR); Dong-Min Shin, Seoul (KR); Kijun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 16/357,431

(22) Filed: Mar. 19, 2019

(65) Prior Publication Data

US 2020/0050513 A1 Feb. 13, 2020

(30) Foreign Application Priority Data

Aug. 7, 2018 (KR) .......................... 10-2018-0091903

(51) Int. Cl.
  *G11C 29/42* (2006.01)
  *G06F 11/10* (2006.01)
  *G06F 3/06* (2006.01)

(52) U.S. Cl.
  CPC ............ *G11C 29/42* (2013.01); *G06F 3/0619* (2013.01); *G06F 3/0659* (2013.01); *G06F 3/0673* (2013.01); *G06F 11/1076* (2013.01)

(58) Field of Classification Search
  CPC ................................ G11C 29/42; G11C 29/44
  See application file for complete search history.

(56) References Cited

U.S. PATENT DOCUMENTS

| 9,337,873 | B2 | 5/2016 | Marrow et al. |
| 9,747,148 | B2 | 8/2017 | Healy et al. |
| 9,772,901 | B2 | 9/2017 | Hoekstra et al. |
| 9,818,488 | B2 | 11/2017 | Sankaranarayanan et al. |
| 9,971,646 | B2 | 5/2018 | Teitel et al. |
| 10,417,086 | B2 * | 9/2019 | Lin .................... G06F 11/1048 |

(Continued)

FOREIGN PATENT DOCUMENTS

| KR | 1020130077962 A | 7/2013 |
| KR | 1020160099967 A | 8/2016 |

(Continued)

*Primary Examiner* — Steve N Nguyen

(74) *Attorney, Agent, or Firm* — Volentine, Whitt & Francos, PLLC

(57) ABSTRACT

An operating method of a memory controller that individually controls a plurality of memory units includes reading respective segments from the plurality of memory units based on a plurality of control signals; generating an output codeword based on the segments; performing error correction decoding on the output codeword; when a result of the error correction decoding indicates success, updating at least one of a plurality of accumulated error pattern information respectively corresponding to the plurality of memory units based on the result of the error correction decoding; and when the result of the error correction decoding indicates failure, regulating at least one of the plurality of control signals based on at least one of the plurality of accumulated error pattern information.

14 Claims, 16 Drawing Sheets

(56) References Cited

U.S. PATENT DOCUMENTS

| | | | |
|---|---|---|---|
| 2007/0201274 A1* | 8/2007 | Yu | G11C 11/5621 |
| | | | 365/185.09 |
| 2009/0132876 A1* | 5/2009 | Freking | G11C 29/56008 |
| | | | 714/723 |
| 2009/0271678 A1* | 10/2009 | Schneider | G11C 7/1006 |
| | | | 714/746 |
| 2011/0029842 A1* | 2/2011 | Grube | G06F 3/064 |
| | | | 714/763 |
| 2011/0197015 A1 | 8/2011 | Chae et al. | |
| 2013/0173985 A1 | 7/2013 | Chung et al. | |
| 2014/0122973 A1 | 5/2014 | Motwani | |
| 2017/0123902 A1 | 5/2017 | Ravimohan et al. | |
| 2018/0026658 A1 | 1/2018 | Park et al. | |

FOREIGN PATENT DOCUMENTS

| | | |
|---|---|---|
| KR | 10-1668934 B1 | 10/2016 |
| KR | 1020180010448 A | 1/2018 |

\* cited by examiner

MEMORY CONTROLLER, OPERATING METHOD OF MEMORY CONTROLLER AND MEMORY SYSTEM

CROSS-REFERENCE TO RELATED APPLICATIONS

A claim for priority under 35 U.S.C. § 119 is made to Korean Patent Application No. 10-2018-0091903 filed on Aug. 7, 2018, in the Korean Intellectual Property Office, the entirety of which is hereby incorporated by reference.

BACKGROUND

The present disclosure relates to a semiconductor memory system, and more particularly to a memory system that performs an error correction operation based on an error correction code (ECC).

Semiconductor memory devices may be classified into volatile memory devices in which data stored therein disappears when power is turned off, and nonvolatile memory devices in which data stored therein is retained even when power is turned off.

An error may occur in the data during the process of writing data to a semiconductor memory device or reading data from a semiconductor memory device. Typically an error correction code may be added to data by a semiconductor memory device before writing the data. In a case where an error is detected in data during a read operation, the semiconductor memory device may restore original data by correcting the detected error by using the error correction code.

However, in a case where data includes many error bits, the probability of successfully correcting the data may be low. Also, in a case of re-reading data for the purpose of again performing decoding and/or error correction, power consumption increases.

SUMMARY

Embodiments of the inventive concepts provide a memory controller and a memory system that may improve the probability of successfully performing error correction on data and that may reduce power consumption according to error correction.

Embodiments of the inventive concepts provide an operating method of a memory controller which individually controls a plurality of memory units. The method includes reading, by the memory controller, respective segments from the plurality of memory units based on a plurality of control signals; generating, by the memory controller, an output codeword based on the segments; performing, by the memory controller, error correction decoding on the output codeword; when a result of the error correction decoding indicates success, updating, by the memory controller, at least one of a plurality of accumulated error pattern information respectively corresponding to the plurality of memory units based on the result of the error correction decoding; and when the result of the error correction decoding indicates failure, regulating, by the memory controller, at least one of the plurality of control signals based on at least one of the plurality of accumulated error pattern information.

Embodiments of the inventive concepts further provide a memory controller including a codeword circuit that generates an output codeword based on a first segment read from a first memory unit depending on a first control signal and a second segment read from a second memory unit depending on a second control signal; an error correction code (ECC) circuit that performs error correction decoding on the output codeword; and a control circuit that operates depending on a result of the error correction decoding. The control circuit regulates at least one of the first control signal and the second control signal based on at least one of first accumulated error pattern information corresponding to the first memory unit and second accumulated error pattern information corresponding to the second memory unit.

Embodiments of the inventive concepts still further provide a memory system including a first memory unit that operates in response to a first control signal, a second memory unit that operates in response to a second control signal; and a memory controller that reads a first segment from the first memory unit based on the first control signal and reads a second segment from the second memory unit based on the second control signal. The memory controller includes a codeword circuit that generates an output codeword based on the first segment and the second segment; an error correction code (ECC) circuit that performs error correction decoding on the output codeword; and a control circuit that operates depending on a result of the error correction decoding. The control circuit regulates at least one of the first control signal and the second control signal based on at least one of first accumulated error pattern information corresponding to the first memory unit and second accumulated error pattern information corresponding to the second memory unit.

Embodiments of the inventive concepts additionally provide a memory controller including a codeword circuit configured to generate an output codeword based on a first segment read from a first memory unit depending on a first control signal and a second segment read from a second memory unit depending on a second control signal; an error correction code (ECC) circuit configured to perform error correction decoding on the output codeword; and a control circuit configured to update at least one of first accumulated error pattern information corresponding to the first memory unit and second accumulated error pattern information corresponding to the second memory unit when a result of the error correction decoding indicates success, and to regulate at least one of the first control signal and the second control signal based on at least one of the first accumulated error pattern information and the second accumulated error pattern information when the result of the error correction decoding indicates failure.

BRIEF DESCRIPTION OF THE FIGURES

The above and other objects and features of the inventive concepts will become apparent in view of the following description of exemplary embodiments thereof with reference to the accompanying drawings.

DETAILED DESCRIPTION

Hereinafter, embodiments of the inventive concepts are described in detail and clearly to such an extent that one of ordinary skill in the art may implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

A memory unit according to embodiments of the inventive concepts to be hereinafter described may mean any memory unit which may operate in response to an individual control signal. In embodiments of the inventive concepts, the memory unit may include for example a memory device, a memory chip, a memory die, a memory bank, a memory block, or memory cells connected to one word line. For example, the memory unit according to embodiments of the inventive concepts may indicate a memory device which may regulate a read voltage individually.

Accordingly, each of memory units according to embodiments of the inventive concepts may be implemented with or as an individual memory package, an individual memory device, an individual memory chip, or an individual memory die. Alternatively, a set of memory units may be implemented with or as one memory package, one memory device, one memory chip, or one memory die.

The memory unit or the set of memory units according to embodiments of the inventive concepts may be implemented with at least one of volatile memory such as for example static RAM (SRAM), dynamic RAM (DRAM), synchronous DRAM (SDRAM) or the like, and a nonvolatile memory such as for example read only memory (ROM), programmable ROM (PROM), electrically programmable ROM (EPROM), electrically erasable and programmable ROM (EEPROM), phase-change RAM (PRAM), magnetic RAM (MRAM), resistive RAM (RRAM), ferroelectric RAM (FRAM), flash memory or the like.

Figure 1:
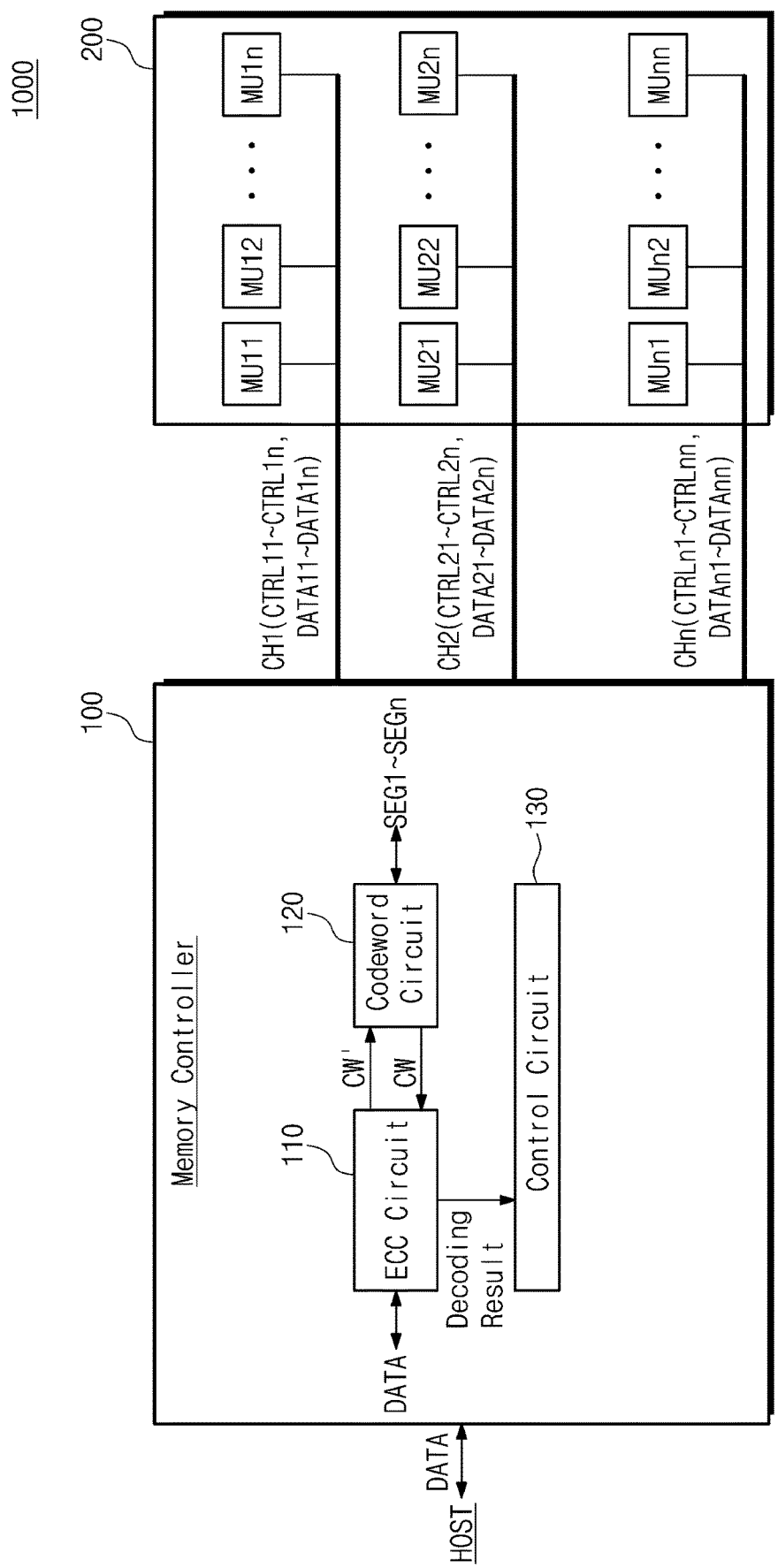
FIG. 1 illustrates a block diagram of a memory system according to an embodiment of the inventive concepts.

FIG. 1 illustrates a block diagram of a memory system according to an embodiment of the inventive concepts. Referring to FIG. 1, a memory system 1000 includes a memory controller 100 and a memory 200. The memory 200 may include a plurality of memory units MU11, MU12 to MU1$n$; MU21, MU22 to MU2$n$; and MUn1, MUn2 to Munn (which may hereinafter be referred to as a plurality of memory units MU11 to Munn).

The memory controller 100 may provide a plurality of control signals CTRL11 to CTRL1$n$, CTRL21 to CTRL2$n$, and CTRLn1 to CTRLnn (which may hereinafter be referred to as a plurality of control signals CTRL11 to CTRLnn) and a plurality of data DATA11 to DATA1$n$, DATA21 to DATA 2$n$, and DATA n1 to DATAnn (which may hereinafter be referred to as a plurality of data DATA11 to DATAnn) to the memory 200 through a plurality of channels CH1, CH2 to CHn. For example, the memory controller 100 may provide the control signals CTRL11 to CTRL1$n$ and the data DATA11 to DATA1$n$ through the first channel CH1, and may provide the control signals CTRL21 to CTRL2$n$ and the data DATA21 to DATA2$n$ through the second channel CH2.

The memory controller 100 may control the respective memory units MU11 to MUnn based on control signals respectively corresponding to the memory units MU11 to MUnn. For example, the memory controller 100 may control the control memory unit MU11 based on the control signal CTRL11 corresponding to the memory unit MU11, and may control the memory unit MU12 based on a control signal CTRL12 corresponding to the memory unit MU12. The memory controller 100 may control the memory unit MU21 based on the control signal CTRL21 corresponding to the memory unit MU21, and may control the memory unit MU22 based on a control signal CTRL22 corresponding to the memory unit MU22.

In an embodiment, the memory controller 100 may transfer a selection signal for the purpose of individually controlling the memory units MU11 to MUnn. The selection signal may be a signal indicating one of memory units connected to one channel. For example, the memory controller 100 may control the memory unit MU11 based on the control signal CTRL11 and the selection signal indicating the memory unit MU11.

The memory controller 100 may store data in the respective memory units MU11 to MUnn and may read the stored data from the respective memory units MU11 to MUnn. For example, the memory controller 100 may provide the control signal CTRL11 and data DATA11 to the first channel CH1 to store the data DATA11 in the memory unit MU11. The memory controller 100 may provide the control signal CTRL21 to the second channel CH2 to store the data DATA21 in the memory unit MU21.

As described above, the memory system 1000 may include a plurality of memory units which may operate in response to individual control signals. The memory controller 100 may individually manage control signals with regard to respective memory units. That is, the memory controller 100 may control respective memory units based on different control signals. The memory controller 100 may control respective memory units by transferring different control signals to different channels. In addition, the memory controller 100 may control respective memory units by transferring different control signals to one channel.

As illustrated in FIG. 1, the memory controller 100 includes an error correction code (ECC) circuit 110, a codeword circuit 120, and a control circuit 130. The ECC circuit 110 may generate an input codeword CW' by performing encoding on data "DATA" provided from a host. The input codeword CW' may be a data code to which an error correction code ECC is added.

The codeword circuit 120 may divide the input codeword CW' provided from the ECC circuit 110 into a plurality of segments SEG1 to SEGn. The codeword circuit 120 may divide the input codeword CW' in compliance with a predetermined division rule.

The control circuit 130 may control the respective memory units MU11 to MUnn based on control signals respectively corresponding to the memory units MU11 to MUnn. For example, the control circuit 130 may store the first segment SEG1 in the memory unit MU11 based on the control signal CTRL11, and may store a second segment SEG2 in the memory unit MU12 based on the control signal CTRL12.

The control circuit 130 may distribute and store the segments SEG1 to SEGn in the memory units MU11 to MUnn. In an embodiment, the control circuit 130 may distribute and store the segments SEG1 to SEGn in memory units connected to a same channel. For example, the control circuit 130 may store the segments SEG1 to SEGn in the memory units MU11 to MU1$n$, respectively. In another embodiment, the control circuit 130 may distribute and store the segments SEG1 to SEGn in memory units connected to different channels. For example, the control circuit 130 may store the segments SEG1 to SEGn in the memory units MU11 to MUn1, respectively. In another embodiment, the control circuit 130 may store the segments SEG1 to SEGn in the memory units MU11 to MUnn in any sequence.

The control circuit 130 may read the segments SEG1 to SEGn distributed and stored in the memory units MU11 to MUnn based on control signals respectively corresponding to the memory units MU11 to MUnn.

The codeword circuit 120 may generate an output codeword CW based on the segments SEG1 to SEGn read from the memory units MU11 to MUnn. The codeword circuit 120 may generate the output codeword CW in compliance with the predetermined division rule. In an embodiment, the generated output codeword CW may include an error bit generated in the process of writing the segments SEG1 to SEGn to the memory units MU11 to MUnn or reading the segments SEG1 to SEGn from the memory units MU11 to MUnn. As such, bits of the input codeword CW' may be different from bits of a corresponding output codeword CW.

The ECC circuit 110 may perform error correction decoding (hereinafter referred to as "decoding") for correcting an error of the generated output codeword CW. For example, the ECC circuit 110 may perform hard decision decoding. The data "DATA" output from the ECC circuit 110 may be provided to a host depending on a result of the decoding. For example, in the case where the decoding result indicates that the decoding operation succeeds, the ECC circuit 110 may provide a decoded codeword (i.e., an error-corrected codeword) to the host. The ECC circuit 110 may provide the decoding result to the control circuit 130.

The control circuit 130 may regulate a control signal corresponding to each of the memory units MU11 to MUnn based on the decoding result from the ECC circuit 110. In an embodiment, the control circuit 130 may regulate a control signal based on accumulated error pattern information corresponding to each of the memory units MU11 to MUnn. The accumulated error pattern information may be accumulated information generated based on an error bit of data output from a memory unit.

The control circuit 130 may regulate a control signal such that the number of error bits of a segment read from a memory unit decreases. For example, since an error bit may occur in the process of writing or reading a segment, the control circuit 130 may regulate a control signal such that a write voltage level or a read voltage level to be provided to a memory unit changes. However, the inventive concepts are not limited regulating a control signal so as to change write and/or read voltage levels. For example, the control circuit 130 may regulate a control signal depending on various conditions associated with an error bit.

Depending on the regulated control signal, the control circuit 130 may store data in the memory units MU11 to MUnn or may read data from the memory units MU11 to MUnn. Since a control signal is regulated in such a way that the number of error bits of a segment read from a memory unit decreases, the number of error bits of the output codeword CW generated based on the regulated control signal may decrease.

As described above, the memory system 1000 may regulate a control signal corresponding to each of the memory units MU11 to MUnn such that the number of error bits of data read from each of the memory units MU11 to MUnn decreases. As such, a raw bit error rate (RBER) of the memory system 1000 may decrease.

The circuits 110 to 130 included in the memory controller 100 of FIG. 1 may be implemented in the form of software, hardware, or a combination thereof. In an embodiment, the software may be a machine code, firmware, an embedded code, and application software. For example, the hardware may include an electrical circuit, an electronic circuit, a processor, a computer, an integrated circuit, integrated circuit cores, a micro electro mechanical system (MEMS), a passive element, or a combination thereof.

Figure 2:
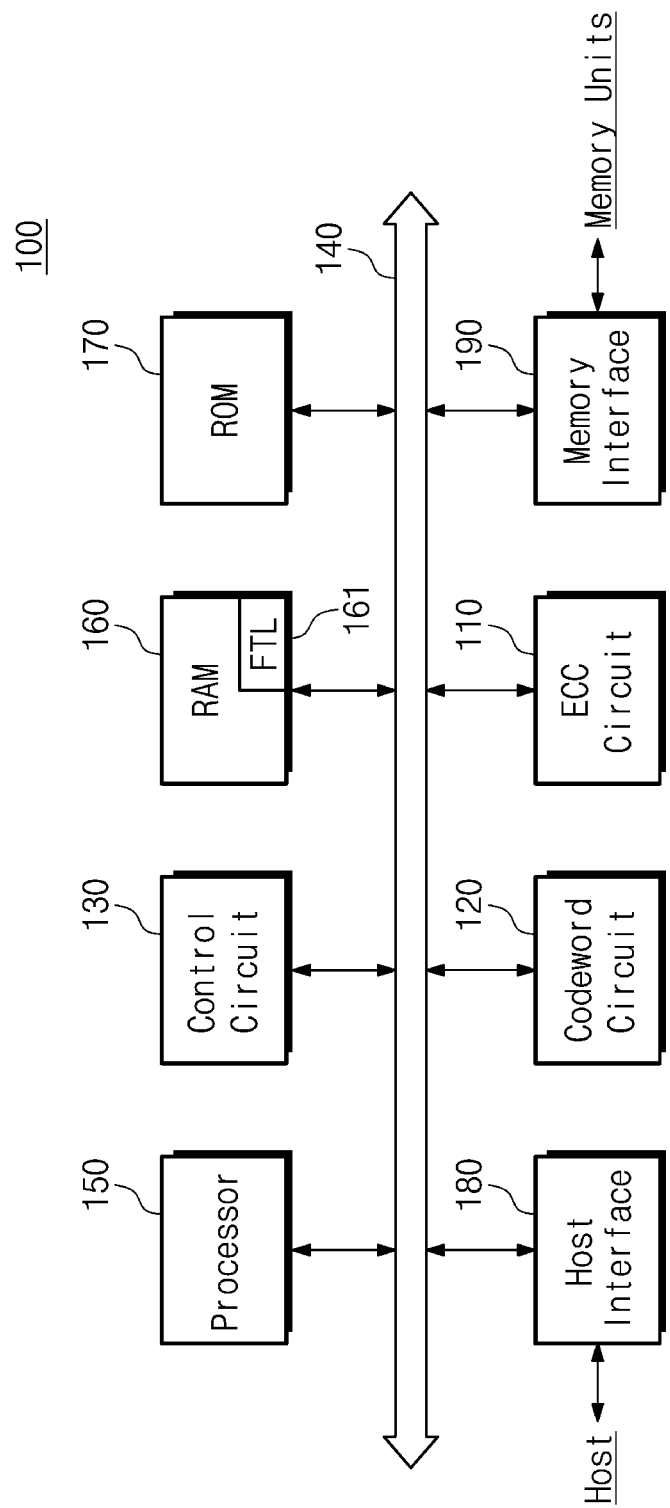
FIG. 2 illustrates a block diagram of a memory controller of FIG. 1.

FIG. 2 illustrates a block diagram of a memory controller of FIG. 1, according to embodiments of the inventive concepts. Referring to FIG. 2, the memory controller 100 includes the ECC circuit 110, the codeword circuit 120, the control circuit 130, a bus 140, a processor 150, a random access memory (RAM) 160, a read only memory (ROM) 170, a host interface 180, and a memory interface 190.

The operations of the ECC circuit 110, the codeword circuit 120, and the control circuit 130 are described with reference to FIG. 1, and thus, additional description will be omitted to avoid redundancy.

The bus 140 is configured to provide a channel between components of the memory controller 100. The processor 150 may control overall operations of the memory controller 100. For example, the ECC circuit 110, the codeword circuit 120, and the control circuit 130 may be driven by the processor 150.

The RAM 160 may be used as a buffer memory, a cache memory, or a working memory of the memory controller 100. The RAM 160 may store codes and commands which the processor 150 executes, and may store data processed by the processor 150. The RAM 160 may include a flash translation layer (FTL) 161. The FTL 161 may be software or firmware which performs various management operations between a host and memory units such that memory units may be efficiently used. In an embodiment, the FTL 161 stored in the RAM 160 may be driven by the processor 150.

In an embodiment, the FTL 161 may assign one of memory units to each of segments. As such, the FTL 161 may manage information about a memory unit corresponding to a segment. The control circuit 130 may store a segment in an assigned memory unit or may read a segment from the assigned memory unit.

The ROM 170 may store a variety of information necessary for the memory controller 100 to operate, in the form of firmware. In the embodiment illustrated in FIG. 2, the FTL 161 is included in the RAM 160. However, in other embodiments the inventive concepts are not so limited, and the FTL 161 may be included in the ROM 170.

The memory controller 100 may communicate with the host through the host interface 180. The memory controller 100 may communicate with memory units through the memory interface 190.

An operation of the memory controller 100 of FIG. 1 will be more fully described with reference to FIGS. 3 to 11. For convenience of description, it is assumed that one memory unit corresponds to each of a plurality of channels. That is, an operation of the memory controller 100 will be described on the basis of an exemplification in which the memory controller 100 controls one memory unit through one channel, but the inventive concepts are not limited thereto. Also, for convenience of description, an operation of the memory controller 100 will be described on the basis of an exemplification in which the control circuit 130 regulates a control signal such that a read voltage level to be provided to a memory unit changes, but the inventive concepts are not limited thereto.

Figure 3:
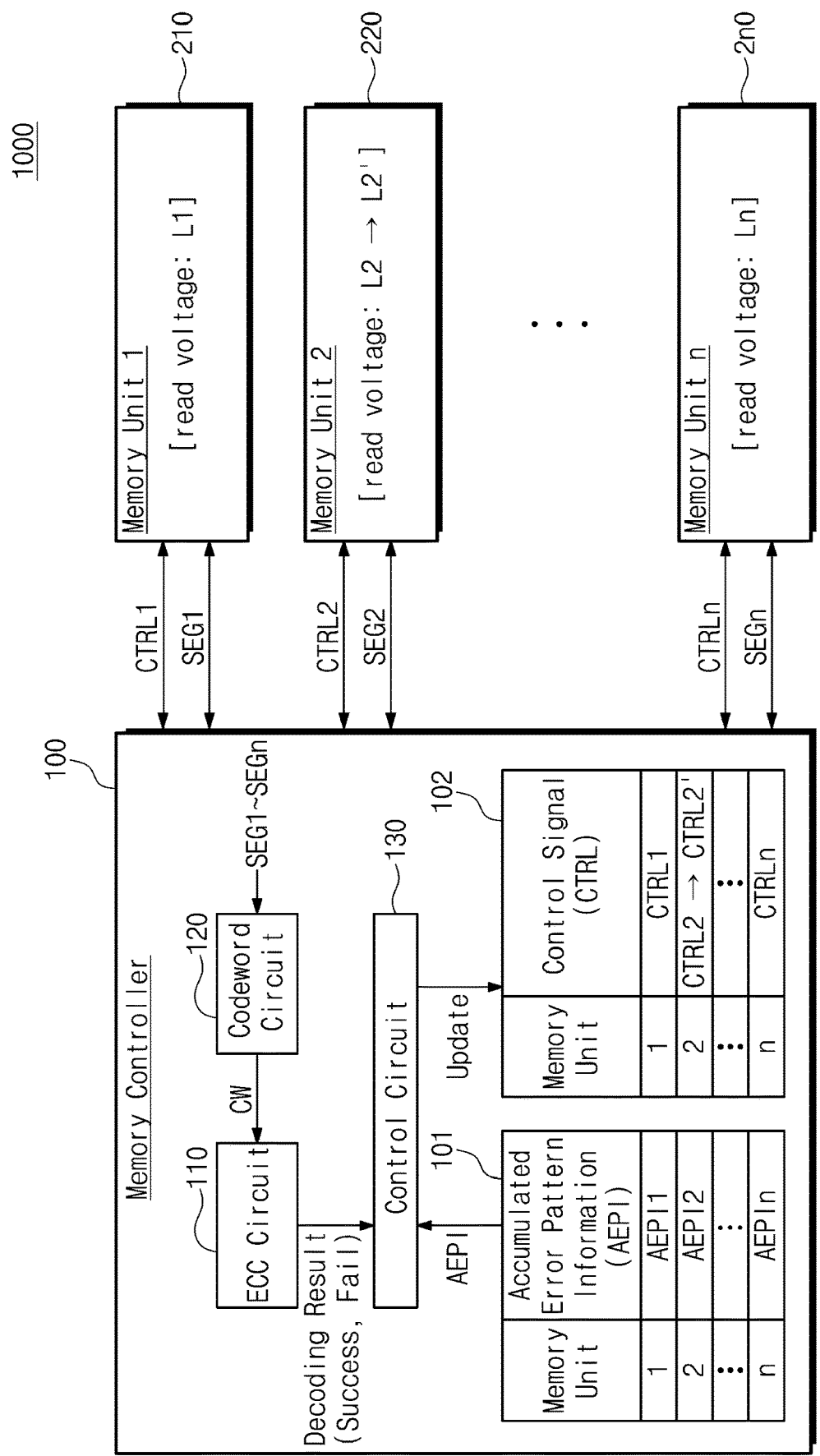
FIG. 3 illustrates a diagram of one exemplification in which a memory system of FIG. 1 regulates a control signal.

FIG. 3 illustrates a diagram of one exemplification in which a memory system of FIG. 1 regulates a control signal. Referring to FIG. 3, the memory system 1000 includes the memory controller 100 and a plurality of memory units 210, 220 to 2n0 (which may hereinafter be referred to as memory units 210 to 2n0). The memory controller 100 may control the memory units 210 to 2n0 based on the plurality of control signals CTRL1, CTRL2 to CTRLn (which may hereinafter be referred to as control signals (CTRL1 to CTRLn). Each of the memory units 210 to 2n0 may individually operate based on the corresponding control signal.

Each of the memory units 210 to 2n0 may store the corresponding segment of the plurality of segments SEG1, SEG2 to SEGn (which may hereinafter be referred to as segments SEG1 to SEGn). For example, the first memory unit 210 may store the first segment SEG1, the second memory unit 220 may store the second segment SEG2, and the n-th memory unit 2n0 may store the n-th segment SEGn.

The control circuit 130 may read the stored segments SEG1 to SEGn from the memory units 210 to 2n0. The control circuit 130 may read the segments SEG1 to SEGn based on a control signal corresponding to a read voltage level of each of the memory units 210 to 2n0. For example, the memory controller 100 may read the first segment SEG1 from the first memory unit 210 based on the control signal CTRL1 corresponding to a read voltage level L1, and may read the second segment SEG2 from the second memory unit 220 based on the control signal CTRL2 corresponding to a read voltage level L2. That is, the first memory unit 210 may output the first segment SEG1 by using a read voltage of the read voltage level L1 in response to the control signal CTRL1, and the second memory unit 220 may output the second segment SEG2 by using a read voltage of the read voltage level L2 in response to the control signal CTRL2. The read voltage level L1 may be different than the read voltage level L2.

The codeword circuit 120 may generate the output codeword CW based on the first to n-th segments SEG1 to SEGn thus read.

The ECC circuit 110 may perform decoding on the output codeword CW. The ECC circuit 110 may determine success or failure as a result of decoding the output codeword CW. In an embodiment, in the case where a decoded codeword is generated by decoding the output codeword CW, the ECC circuit 110 may determine that the decoding succeeds (i.e., decoding success). In the case where a decoded codeword is not generated by decoding the output codeword CW, the ECC circuit 110 may determine that the decoding fails (i.e., decoding failure).

In the case where the decoding result is output, the control circuit 130 may regulate the control signals CTRL1 to CTRLn based on accumulated error pattern information AEPI of an error pattern information table 101. The control circuit 130 may regulate a control signal associated with a particular memory unit based on the accumulated error pattern information AEPI corresponding to the particular memory unit. For example, the error pattern information table 101 may be stored in the RAM 160 or the ROM 170 of FIG. 2. For example, the error pattern information table 101 may respectively store accumulated error pattern information AEPI1, AEPI2 to AEPIn for memory units 1, 2 to n (i.e., memory units 210, 220 to 2n0). As illustrated in FIG. 3, the control circuit 130 may for example regulate the control signal CTRL2 based on accumulated error pattern information AEPI2 corresponding to the second memory unit 220. The control circuit 130 may regulate the control signal CTRL2 such that the read voltage level L2 of the second memory unit 220 changes to a read voltage level L2'. As such, the control circuit 130 may control the second memory unit 220 based on the regulated control signal CTRL2' instead of the control signal CTRL2. In the case where the regulated control signal CTRL2' is transferred or sent to the second memory unit 220, the second memory unit 220 may output stored data by using the read voltage level L2'.

The control circuit 130 may manage the control signals CTRL1 to CTRLn corresponding to the memory units 210 to 2n0 based on a control signal management table 102. The control signal management table 102 may store a control signal corresponding to each of the memory units 210 to 2n0. The control circuit 130 may regulate the control signals based on the accumulated error pattern information AEPI, and may update a control signal stored in the control signal management table 102 based on the regulated control signals. Afterwards, the control circuit 130 may control the memory units 210 to 2n0 based on the regulated control signals stored in the control signal management table 102. For example, the control signal management table 102 may be stored in the RAM 160 or the ROM 170 of FIG. 2. For example, the control signal management table 102 as shown in FIG. 3 may respectively store control signals CTRL1, regulated control signal CTRL2' to CTRLn for memory units 1, 2 to n (i.e., memory units 210, 220 to 2n0).

As illustrated in FIG. 3, the control circuit 130 may regulate the control signal CTRL2 based on the accumulated error pattern information AEPI2, and may update the control signal CTRL2 corresponding to the second memory unit 220 of the control signal management table 102 based on the regulated control signal CTRL2'. Afterwards, the control circuit 130 may control the second memory unit 220 based on the regulated control signal CTRL2' stored in the control signal management table 102.

In an embodiment, the control circuit 130 may regulate all or a part of the control signals CTRL1 to CTRLn depending on the accumulated error pattern information AEPI. As such, the control circuit 130 may update all or a part of the control signals CTRL1 to CTRLn of the control signal management table 102.

Hereinafter, an operation of a memory controller according to embodiments of the inventive concepts will be more fully described with reference to FIGS. 4 to 11. In detail, an operation of the memory controller 100 according to a decoding success will be described with reference to FIGS. 4 to 8, and an operation of the memory controller 100 according to a decoding failure will be described with reference to FIGS. 9 to 11.

Figure 4:
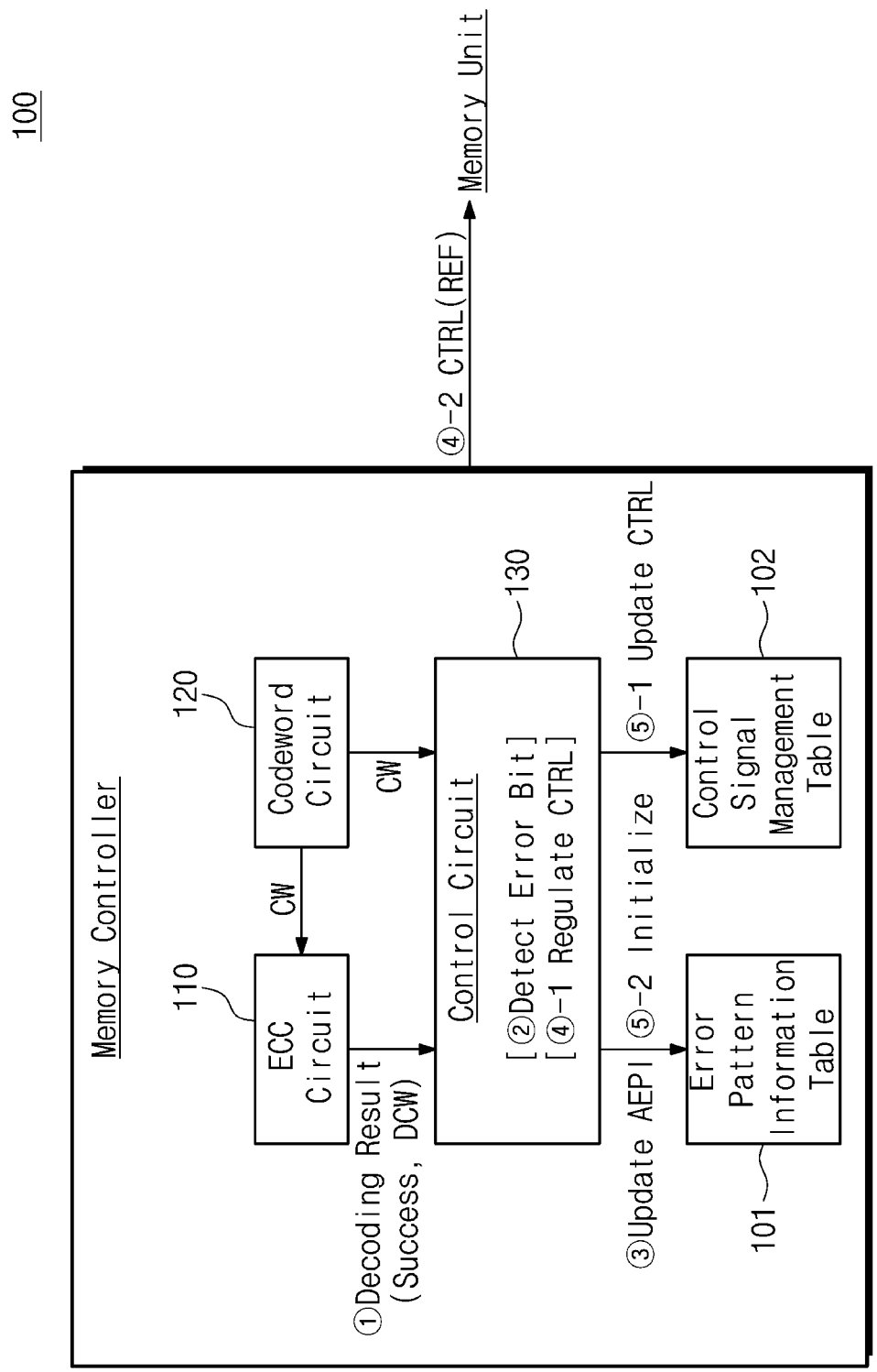
FIG. 4 illustrates a block diagram of an operation according to a decoding success of a memory controller of FIG. 3.

FIG. 4 illustrates a block diagram of an operation of a memory controller of FIG. 3 according to a decoding success. Referring to FIG. 4, the memory controller 100 is shown as including the ECC circuit 110, the codeword circuit 120, the control circuit 130, the error pattern information table 101, and the control signal management table 102.

In a case where a decoding result indicates a success, the ECC circuit 110 may provide the control circuit 130 with a decoding result "Success" in which a decoded codeword DCW is included (①of FIG. 4).

The control circuit 130 may receive the decoding result "Success", in which the decoded codeword DCW is included, from the ECC circuit 110 and may receive the output codeword CW from the codeword circuit 120. The control circuit 130 may detect an error bit by comparing the output codeword CW and the decoded codeword DCW (②of FIG. 4). The control circuit 130 may determine a memory unit at which the detected error bit occurs.

The control circuit 130 may update the accumulated error pattern information AEPI of the error pattern information table 101 corresponding to the determined memory unit based on the detected error bit (③of FIG. 4). An operation in which the control circuit 130 detects an error bit and updates the error pattern information table 101 will be more fully described with reference to FIG. 5.

The control circuit 130 may regulate the control signal CTRL based on the updated accumulated error pattern information AEPI of the error pattern information table 101 (④-1 of FIG. 4). In an embodiment, the control circuit 130 may regulate the control signal CTRL of a memory unit corresponding to the updated accumulated error pattern information AEPI. The control circuit 130 may update the control signal CTRL of the control signal management table 102 depending on the regulated control signal (⑤-1 of FIG. 4). An operation in which the control circuit 130 regulates the control signal CTRL based on the accumulated error pattern information AEPI will be more fully described with reference to FIGS. 6 and 7A-7C.

In a case where the updated accumulated error pattern information AEPI satisfies a condition set in advance, the control circuit 130 may refresh data stored in a memory unit corresponding to the updated accumulated error pattern information AEPI without regulating the control signal CTRL. That is, the control circuit 130 may rewrite data stored in a memory unit. The control circuit 130 may refresh a memory unit by transferring the control signal CTRL, in which a refresh command REF is included, to the memory unit (④-2 of FIG. 4). The control circuit 130 may initialize the accumulated error pattern information AEPI corresponding to the refreshed memory unit of the error pattern information table 101 (⑤-2 of FIG. 4). An operation in which the control circuit 130 refreshes a memory unit and initializes the accumulated error pattern information AEPI will be more fully described with reference to FIG. 8.

Figure 5:
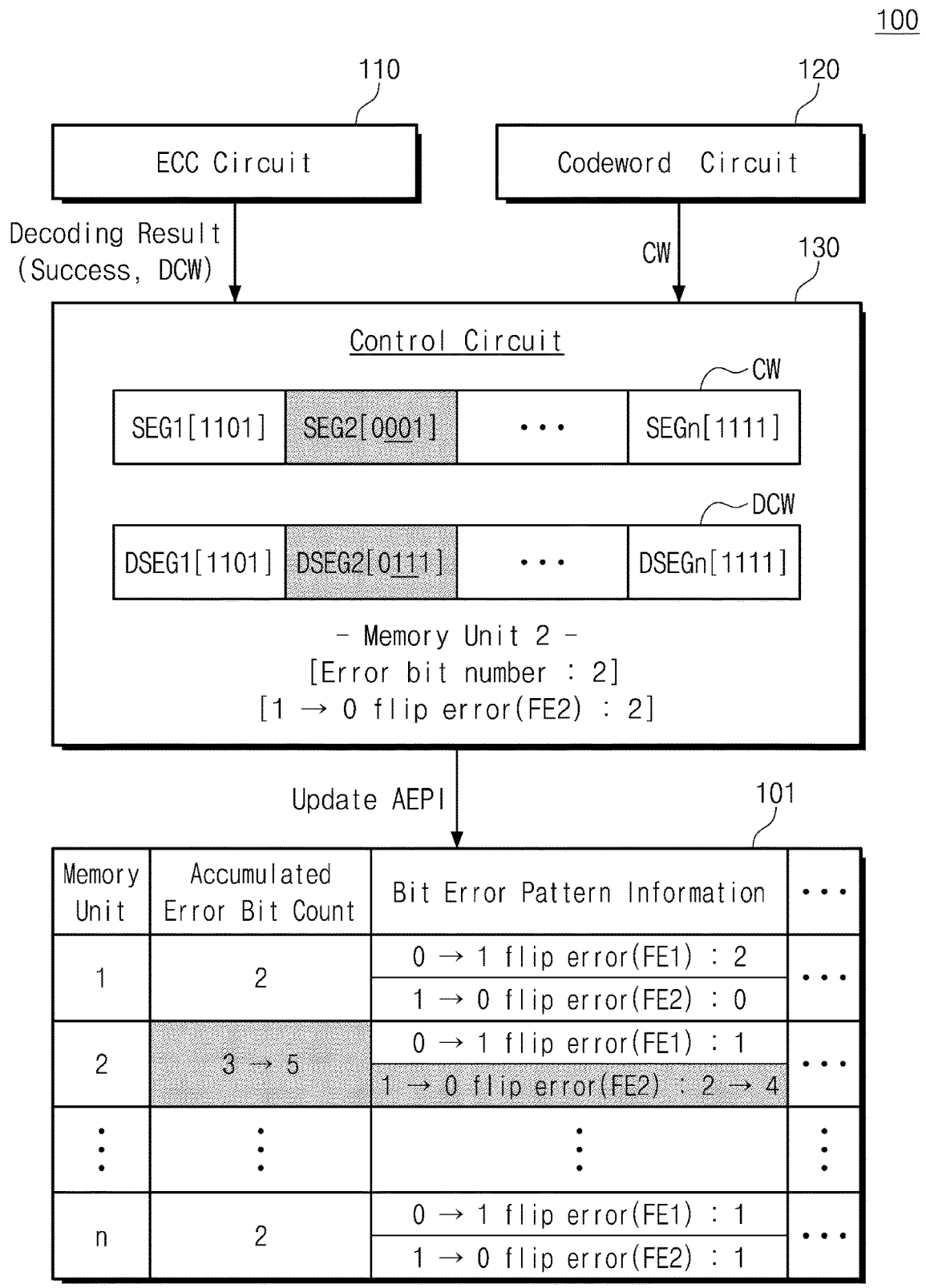
FIG. 5 illustrates a diagram of an exemplification in which a memory controller of FIG. 4 updates an error pattern information table based on a decoding success.

FIG. 5 illustrates a diagram of an exemplification in which a memory controller of FIG. 4 updates an error pattern information table based on a decoding success. Referring to FIG. 5, based on a decoding success, the control circuit 130 may receive the decoding result "Success", in which the decoded codeword DCW is included, from the ECC circuit 110 and may receive the output codeword CW from the codeword circuit 120. The control circuit 130 may detect an error bit by comparing the output codeword CW and the decoded codeword DCW. The control circuit 130 may respectively compare bits of the output codeword CW and bits of the decoded codeword DCW, and may detect a bit of the output codeword CW which is different in value from a bit of the decoded codeword DCW as an error bit.

As illustrated in FIG. 5, the control circuit 130 may detect an error bit by comparing bits of each of the segments SEG1 to SEGn of the output codeword CW and bits of each of segments DSEG1 to DSEGn of the decoded codeword DCW. The control circuit 130 may detect a second bit "0" and a third bit "0" of bits "0001" included in the second segment SEG2 of the output codeword CW as an error bit (i.e., as error bits). The control circuit 130 may determine that the detected error bits are included in the segment SEG2. As such, the control circuit 130 may determine that an error bit occurs at the second memory unit 220 (see FIG. 3).

For example, the control circuit 130 may determine whether an error bit is included in any segment, based on the predetermined division rule used at the codeword circuit 120. Alternatively, the control circuit 130 may divide the output codeword CW and the decoded codeword DCW based on the predetermined division rule, and the control circuit 130 may compare a particular segment of the output codeword CW and a particular segment of the decoded codeword DCW to determine an error bit included in the particular segment. Here, the particular segment of the output codeword CW and the particular segment of the decoded codeword DCW may correspond to each other.

The control circuit 130 may calculate the number of error bits and bit error pattern information of each memory unit based on the determined error bit(s). In the case where a bit of the output codeword CW is decoded to a different bit value, the bit error pattern information may be information about the number of errors corresponding to each of bit error kinds. In an embodiment, a bit error kind may include a first flip error FE1 in which a bit value of "0" is flipped to a different bit value of "1", and a second flip error FE2 in which a bit value of "1" is flipped to a different bit value of "0". That is, when the first flip error FE1 is generated, an error bit of "0" in the output codeword CW may be detected. And when the second flip error FE2 is generated, an error bit of "1" in the output codeword CW may be detected.

As illustrated in FIG. 5, in the case where a second bit value "0" of the second segment SEG2 is decoded to a different bit value of "1" (i.e., the second flip error FE2 occurs) and a third bit value "0" of the second segment SEG2 is decoded to a different bit value of "1" (i.e., the second flip error FE2 occurs), the control circuit 130 may calculate the number of error bits of the second memory unit 220 to be "2". Also, the control circuit 130 may calculate the number of the second flip errors FE2 as bit error pattern information. In the example of FIG. 5, the number of the second flip errors FE2 may be "2".

The control circuit 130 may update the error pattern information table 101 based on the number of error bits thus calculated and the bit error pattern information thus calculated. As illustrated in FIG. 5, the error pattern information table 101 may include an accumulated error bit count and bit error pattern information. That is, the accumulated error pattern information AEPI may include the accumulated error bit count and the bit error pattern information.

As illustrated in FIG. 5, before the error pattern information table 101 is updated, the accumulated error bit count corresponding to the second memory unit 220 may have been "3", the number of first flip errors FE1 may have been "1", and the number of second flip errors FE2 may have been "2". The control circuit 130 may thus update the accumulated error bit count corresponding to the second memory unit 220 from "3" to "5" based on the number of calculated error bits. The control circuit 130 may also update the number of second flip errors FE2 from "2" to "4" depending on a result of the calculation.

The embodiment of FIG. 5 shows the error pattern information table 101 as including the accumulated error bit count and bit error pattern information as the accumulated error pattern information AEPI. However, other embodiments of the inventive concepts are not so limited, and the error pattern information table 101 may for example include various information associated with an error bit.

Figure 6:
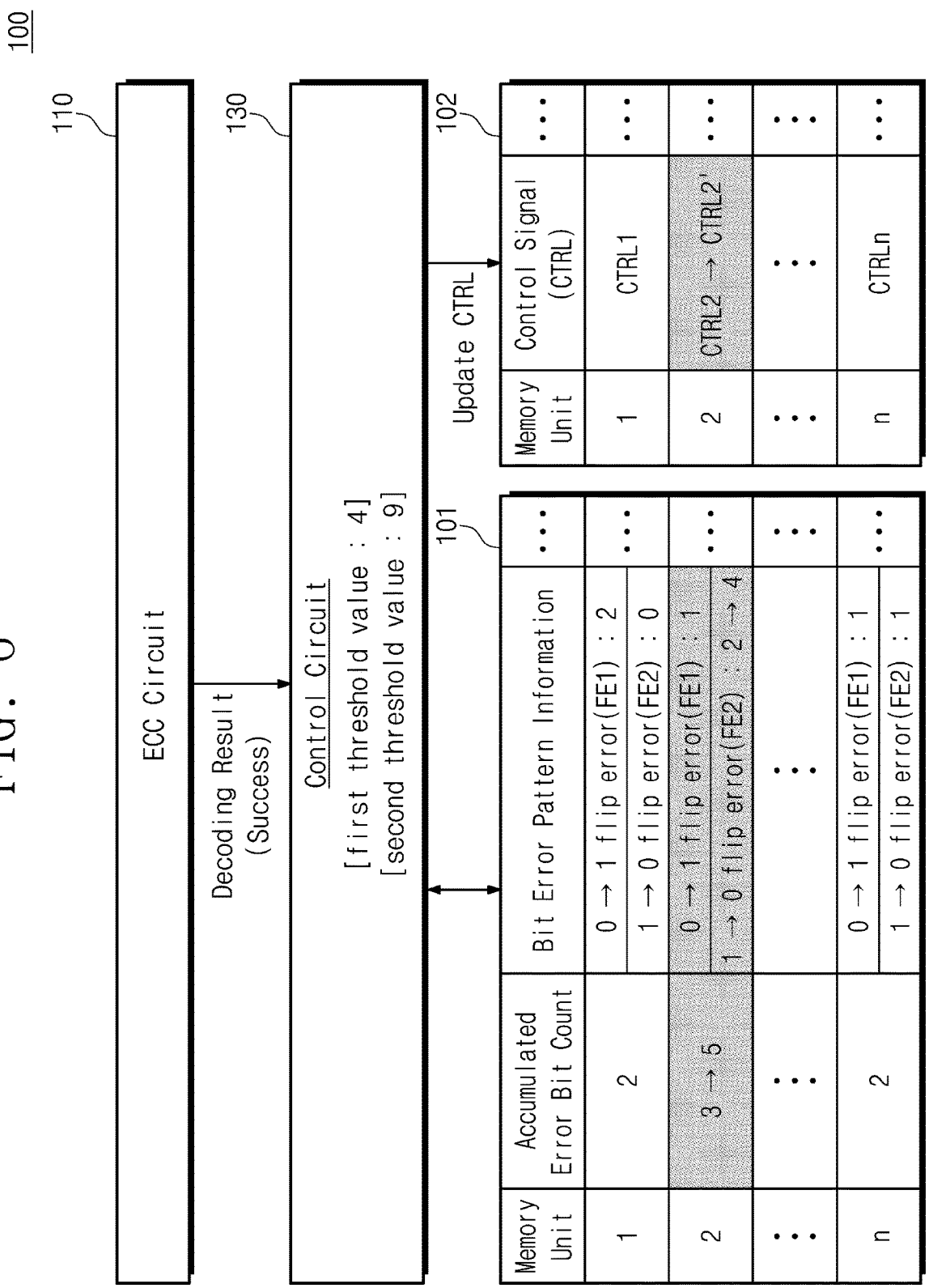
FIG. 6 illustrates a diagram of an exemplification in which a memory controller of FIG. 4 regulates a control signal according to a decoding success.

FIG. 6 illustrates a diagram of an exemplification in which a memory controller of FIG. 4 regulates a control signal according to a decoding success. Referring to FIG. 6, the control circuit 130 may receive a decoding result "Success" from the ECC circuit 110 and may update the error pattern information table 101 (such as described with respect to FIG. 5 for example). As illustrated in FIG. 6, the control circuit 130 may update the accumulated error bit count corresponding to the second memory unit 220 from "3" to "5" and may update the number of second flip errors FE2 from "2" to "4".

The control circuit 130 may determine whether the updated accumulated error bit count is not smaller than a first threshold value and is smaller than a second threshold value. In the case where the updated accumulated error bit count is not smaller than the first threshold value and is smaller than the second threshold value, the control circuit 130 may regulate a control signal of a relevant memory unit. For example, the control circuit 130 may regulate a control signal such that a read voltage level of the relevant memory unit is regulated. In this case, the first threshold value may be a reference value for regulating a read voltage level. The second threshold value may be a reference value for performing any other operation (e.g., a refresh operation) while the control circuit 130 does not regulate a control signal.

As illustrated in FIG. 6, in the case where the updated accumulated error bit count is "5", the first threshold value is "4", and the second threshold value is "9", the updated accumulated error bit count may be not smaller than the first threshold value and may be smaller than the second threshold value. In this case, the control circuit 130 may regulate the control signal CTRL2 such that a read voltage level of the second memory unit 220 is regulated. As such, the control signal CTRL2 corresponding to the second memory unit 220 of the control signal management table 102 may be updated to the regulated control signal CTRL2'. In an embodiment, in a read operation associated with the second memory unit 220, the control circuit 130 may read data from the second memory unit 220 by using the regulated control signal CTRL2'.

The control circuit 130 may determine a direction and a magnitude to regulate a read voltage level, based on the updated accumulated error bit count or the updated bit error pattern information. For example, the control circuit 130 may increase the magnitude of the read voltage level in a preset direction in proportion to the updated accumulated error bit count.

Hereinafter, an operation in which the control circuit 130 determines a direction and a magnitude to regulate a read voltage level based on bit error pattern information will be more fully described with reference to FIGS. 7A to 7C.

Figure 7A:
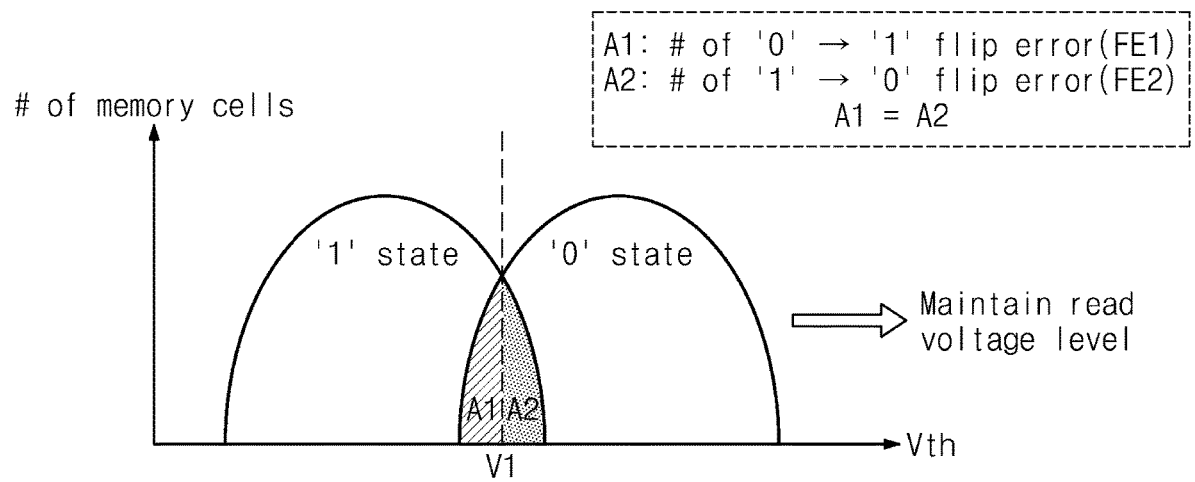
FIGS. 7A, 7B and 7C illustrate diagrams of an exemplification in which a control circuit determines a read voltage level according to an embodiment of the inventive concepts.
Figure 7B:
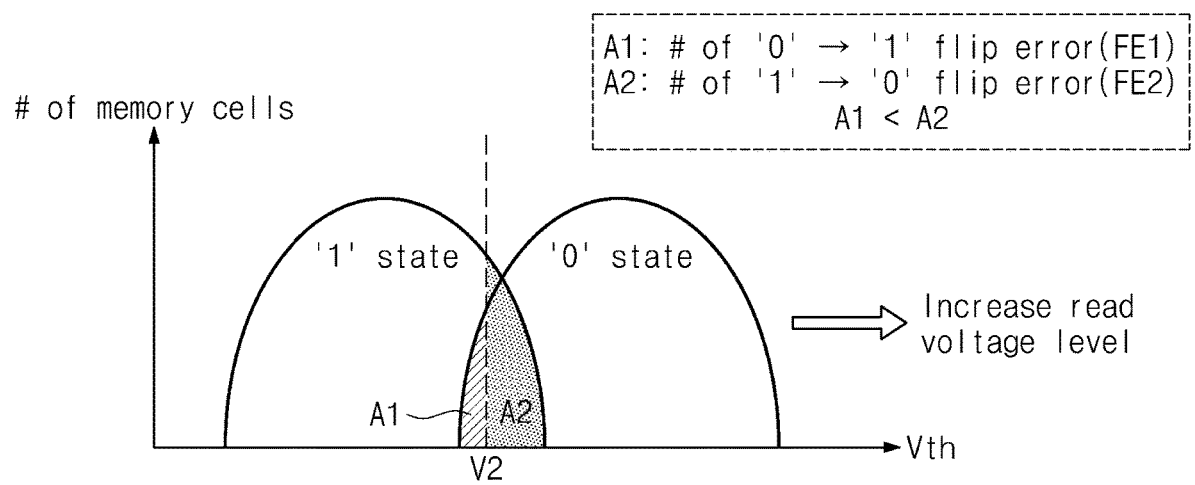
Figure 7C:
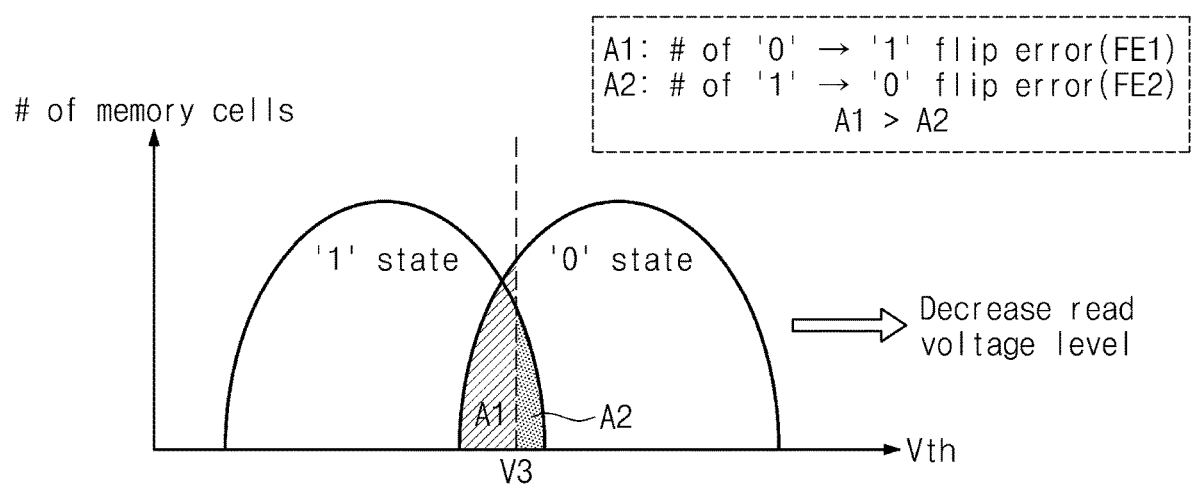

FIGS. 7A, 7B and 7C illustrate diagrams of an exemplification in which a control circuit determines a read voltage level according to an embodiment of the inventive concepts. In detail, FIG. 7A shows an exemplification in which the control circuit 130 performs a read operation by using a first voltage V1. FIG. 7B shows an exemplification in which the control circuit 130 performs a read operation by using a second voltage V2. FIG. 7C shows an exemplification in which the control circuit 130 performs a read operation by using a third voltage V3. Referring to FIGS. 7A to 7C, a threshold voltage distribution of memory cells included in a memory unit is illustrated. In FIGS. 7A to 7C, a horizontal axis represents a threshold voltage of memory cells, and a vertical axis represents the number of memory cells. In FIGS. 7A to 7C, a memory cell of state "0" included in a first area A1 may be determined as a memory cell of state "1". A memory cell of state "1" included in a second area A2 may be determined as a memory cell of state "0". That is, the first area A1 may be an area in which the first flip error FE1 occurs, and the second area A2 may be an area in which the second flip error FE2 occurs.

Referring to FIG. 7A, in the case where a read operation is performed based on the first voltage V1, since the size of the first area A1 is identical to the size of the second area A2, the number of first flip errors FE1 may be identical to the number of second flip errors FE2. In this case, the control circuit 130 may maintain a read voltage level. Accordingly, the control circuit 130 may maintain a control signal corresponding to a memory unit.

Referring to FIG. 7B, in the case where a read operation is performed based on the second voltage V2, since the size of the first area A1 is smaller than the size of the second area A2, the number of first flip errors FE1 which will occur in the first area A1 may be smaller than the number of second flip errors FE2 which will occur in the second area A2. In this case, the control circuit 130 may increase a read voltage level. That is, in the case where the number of first flip errors FE1 is smaller than the number of second flip errors FE2, the control circuit 130 may determine a direction to regulate a read voltage level to be positive. The control circuit 130 may determine the magnitude to regulate a read voltage level depending on a difference between the number of first flip errors FE1 and the number of second flip errors FE2. Accordingly, the control circuit 130 may regulate a control signal such that a read voltage level is increased depending on the determined regulation magnitude.

Referring to FIG. 7C, in the case where a read operation is performed based on the third voltage V3, since the size of the first area A1 is larger than the size of the second area A2, the number of first flip errors FE1 which will occur in the first area A1 may be greater than the number of second flip errors FE2 which will occur in the second area A2. In this case, the control circuit 130 may decrease a read voltage level. That is, in the case where the number of first flip errors FE1 is greater than the number of second flip errors FE2, the control circuit 130 may determine a direction to regulate a read voltage level to be negative. The control circuit 130 may determine the magnitude to regulate a read voltage level depending on a difference between the number of first flip errors FE1 and the number of second flip errors FE2. Accordingly, the control circuit 130 may regulate a control signal such that a read voltage level is decreased depending on the determined regulation magnitude.

In the embodiments of FIGS. 7A to 7C, single level cells (SLC) that store one bit in a memory cell are exemplified. However, other embodiments of the inventive concepts are not so limited. For example, the inventive concepts may be applied to multi-level cells (MLC) that store a plurality of bits in a memory cell. In this case, the control circuit 130 may regulate a control signal such that a plurality of read voltage levels are regulated.

As described above, the control circuit 130 may determine a read voltage level based on bit error pattern information as described with reference to FIGS. 7A to 7C, and may regulate a control signal depending on the determined read voltage level. However, the inventive concepts are not so limited thereto, and for example the control circuit 130 may obtain a read voltage level from bit error pattern information through machine learning and may regulate a control signal depending on the obtained read voltage level.

Figure 8:
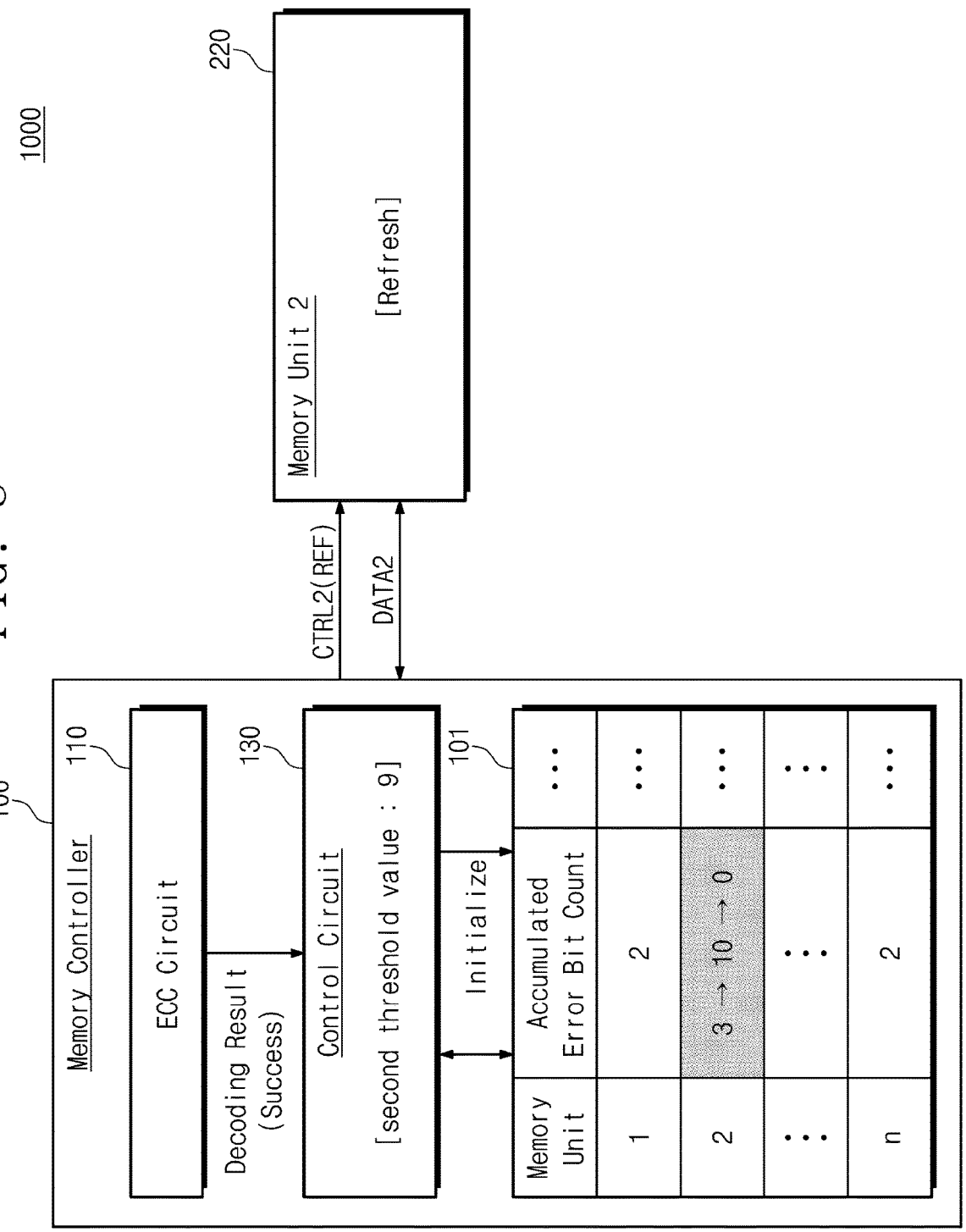
FIG. 8 illustrates a diagram of an exemplification in which a memory controller of FIG. 4 refreshes data of a memory unit depending on a decoding success.

FIG. 8 illustrates a diagram of an exemplification in which a memory controller of FIG. 4 refreshes data of a memory unit depending on a decoding success. Referring to FIG. 8, the control circuit 130 may receive a decoding result "Success" from the ECC circuit 110 and may update the error pattern information table 101. As illustrated in FIG. 8, the control circuit 130 may update the accumulated error bit count corresponding to the second memory unit 220 from "3" to "10".

The control circuit 130 may determine whether the updated accumulated error bit count is not smaller than the second threshold value. In the case where the updated accumulated error bit count is not smaller than the second threshold value, the control circuit 130 may refresh data stored in a relevant memory unit. As illustrated in FIG. 8, in the case where the updated accumulated error bit count (e.g., 10) is not smaller than the second threshold value (e.g., 9), the control circuit 130 may provide the control signal CTRL2 in which the refresh command REF is included to the second memory unit 220. The second memory unit 220 may perform a refresh operation in response to the refresh command REF. As such, all data stored in the second memory unit 220 may be rewritten.

In the case where the data of the second memory unit 220 are rewritten, existing accumulated error pattern information AEPI associated with the second memory unit 220 may not be associated with the second memory unit 220. For this reason, the control circuit 130 may initialize the accumulated error pattern information AEPI corresponding to the second memory unit 220 of the error pattern information table 101. As illustrated in FIG. 8, the control circuit 130 may initialize the accumulated error bit count corresponding to the second memory unit 220 to "0".

As described above, in the case where the decoding result indicates a success, the memory controller 100 may regulate a control signal corresponding to a memory unit based on the accumulated error pattern information AEPI. The memory controller 100 may regulate a control signal based on a decoding result of a memory unit such that a read voltage level of the memory unit is regulated. Accordingly, the number of error bits of data output from the memory unit may decrease, and the probability that a decoding failure occurs may decrease. That is, the raw bit error rate (RBER) of the memory system 1000 may decrease.

Also, in the case where the accumulated error bit count is not smaller than a preset value, the memory controller 100 may refresh data of a relevant memory unit. As a result, the reliability of data stored in the refreshed memory unit is improved.

Figure 9:
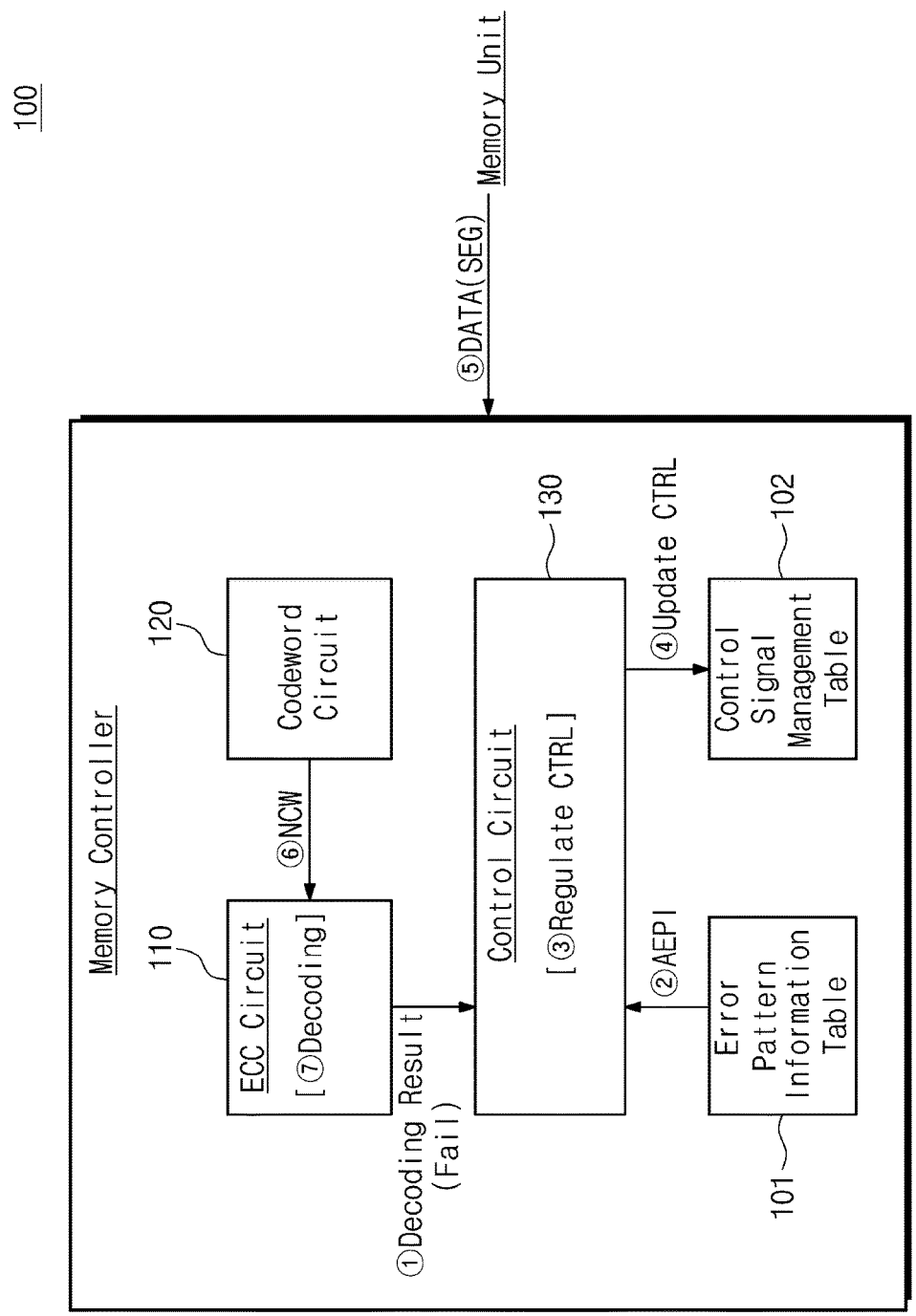
FIG. 9 illustrates a block diagram of an operation of a memory controller of FIG. 3 according to a decoding failure.

FIG. 9 illustrates a block diagram of an operation according to a decoding failure of a memory controller of FIG. 3. Referring to FIG. 9, the memory controller 120 is shown as including the ECC circuit 110, the codeword circuit 120, the control circuit 130, the error pattern information table 101, and the control signal management table 102.

In the case where a decoding result associated with the output codeword CW indicates fail (i.e., decoding failure), the control circuit 130 may receive the decoding result "Fail" from the ECC circuit 110 (① of FIG. 9). The control circuit 130 may regulate the control signal CTRL (③ of FIG. 9) based on the accumulated error pattern information AEPI of the error pattern information table 101 (② of FIG. 9). In an embodiment, the control circuit 130 may regulate the control signal CTRL of a memory unit corresponding to an accumulated error pattern information AEPI satisfying a preset condition. The control circuit 130 may update the control signal management table 102 depending on the regulated control signal (④ of FIG. 9). An operation in which the control circuit 130 regulates the control signal CTRL based on the decoding failure will be more fully described with reference to FIG. 10.

The control circuit 130 may re-read a segment SEG stored in a memory unit based on the regulated control signal CTRL (⑤ of FIG. 9). In an embodiment, the control circuit 130 may re-read only a segment SEG, which is stored in a memory unit corresponding to the regulated control signal, from among the segments SEG1 to SEGn stored in the memory units 210 to 2n0. That is, only segments stored in some memory units of the memory units 210 to 2n0 may be re-read. An operation in which the control circuit 130 re-reads a segment SEG stored in a memory unit based on a regulated control signal will be more fully described with reference to FIG. 10.

The codeword circuit 120 may generate a new output codeword NCW based on the re-read segment SEG (⑥ of FIG. 9). In an embodiment, in the case where only segments stored in some memory units are re-read, the codeword circuit 120 may generate the new output codeword NCW based on the re-read segments and previously read segments. The ECC circuit 110 may perform decoding on the new output codeword NCW (⑦ of FIG. 9). An operation in which the codeword circuit 120 generates the new output codeword NCW and an operation in which the ECC circuit 110 performs decoding of the new output codeword NCW will be more fully described with reference to FIG. 11.

Figure 10:
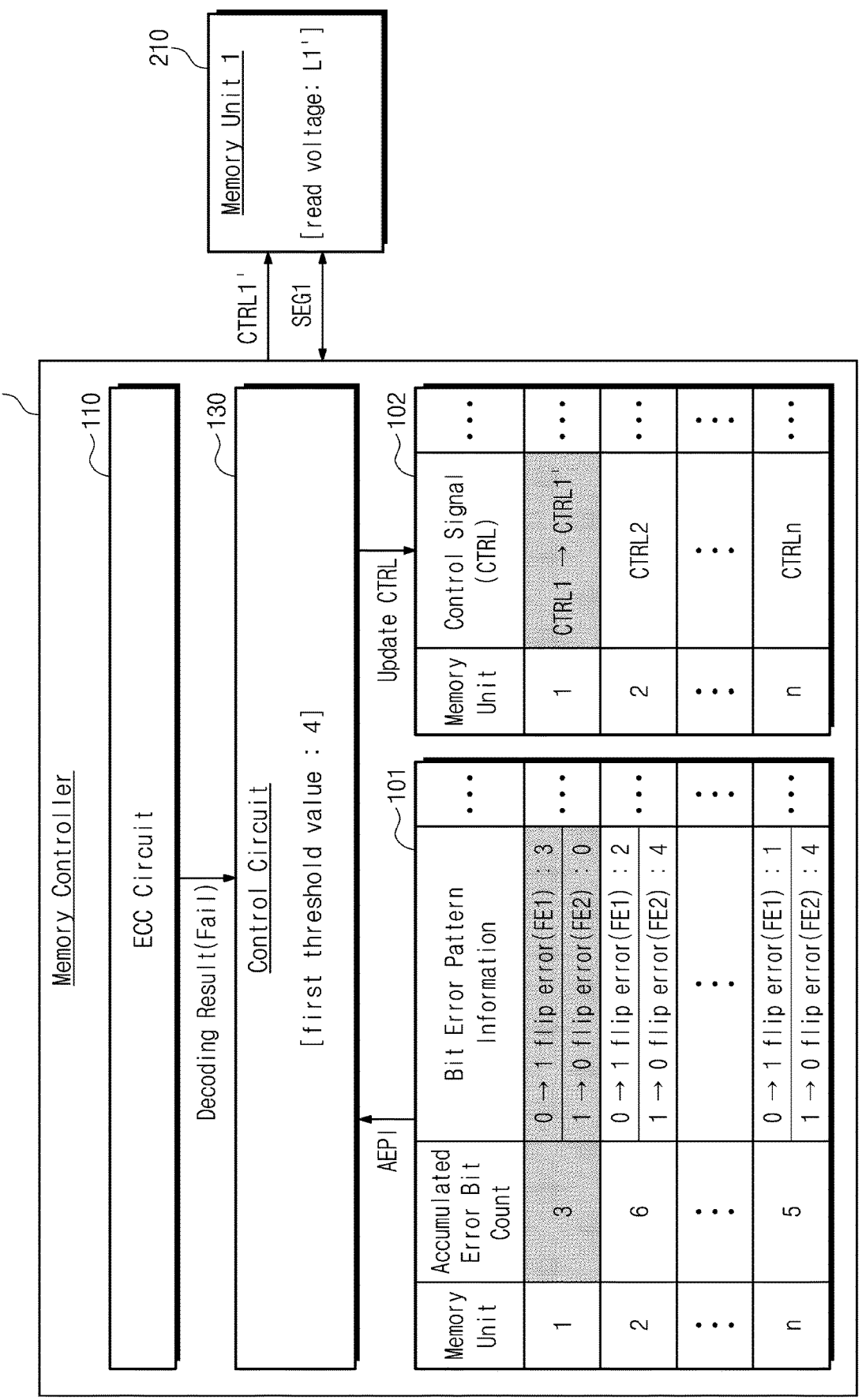
FIG. 10 illustrates a diagram of an exemplification in which a memory controller of FIG. 9 re-reads a segment based on a decoding failure.

FIG. 10 illustrates a diagram of an exemplification in which a memory controller of FIG. 9 re-reads a segment depending on a decoding failure. Referring to FIG. 10, the control circuit 130 may receive a decoding result "Fail" from the ECC circuit 110 based on a decoding failure. In response to the decoding result "Fail", the control circuit 130 may determine whether the accumulated error bit count corresponding to each of the memory units 210 to 2n0 is smaller than the first threshold value. In the case where the accumulated error bit count is not smaller than the first threshold value, as described with reference to FIG. 6, a control signal of a relevant memory unit may be a previously regulated control signal. As such, in the case where the accumulated error bit count is smaller than the first threshold value, the control circuit 130 may regulate a control signal of a relevant memory unit. For example, the first threshold value may be identical to the first threshold value of FIG. 6. The control circuit 130 may update the control signal management table 102 depending on the regulated control signal.

As illustrated in FIG. 10, in the error pattern information table 101, the accumulated error bit count corresponding to the first memory unit 210 may be "3", the accumulated error bit count corresponding to the second memory unit 220 may be "6", and the accumulated error bit count corresponding to the n-th memory unit 2n0 may be "5" (see memory units 210, 220 and 2n0 in FIG. 3). The control circuit 130 may determine whether the accumulated error bit count corresponding to each of the memory units 210 to 2n0 is smaller than the first threshold value. In the case where the accumulated error bit count corresponding to the first memory unit 210 is "3" and the first threshold value is "4", the accumulated error bit count corresponding to the first memory unit 210 is smaller than the first threshold value. In this case, the control circuit 130 may regulate the control signal CTRL1 of the first memory unit 210. As illustrated in FIG. 10, the control circuit 130 may regulate the control signal CTRL1 such that the first memory unit 210 performs a read operation based on a regulated read voltage level L1'. The control circuit 130 may update the control signal management table 102 depending on the regulated control signal CTRL1'.

In an embodiment, the control circuit 130 may determine the read voltage level L1' corresponding to the first memory unit 210 based on the accumulated error bit count or bit error pattern information. As illustrated in FIG. 10, with regard to the first memory unit 210, the number of first flip errors FE1 may be "3", and the number of second flip errors FE2 may be "0". The control circuit 130 may determine the read voltage level L1' based on the number of first flip errors FE1 and the number of second flip errors FE2, which are associated with the first memory unit 210. As illustrated in FIGS. 7A to 7C, since the number of first flip errors FE1 is more than the number of second flip errors FE2, the control circuit 130 may determine the read voltage level L1', or in other words adjust the read voltage level L1' in a direction, so that the magnitude of read voltage level L1' decreases. The control circuit 130 may determine a decrement based on a difference between the number of first flip errors FE1 and the number of second flip errors FE2.

The control circuit 130 may re-read a segment from a memory unit based on a regulated control signal. In an embodiment, the control circuit 130 may re-read only a segment which is associated with a memory unit corresponding to the regulated control signal, from among the segments SEG1 to SEGn stored in the memory units 210 to 2n0. As illustrated in FIG. 10, the control circuit 130 may re-read the first segment SEG1 from the first memory unit 210 based on the regulated control signal CTRL1'. In response to the regulated control signal CTRL1', the first memory unit 210 may output the first segment SEG1 by using a read voltage of the read voltage level L1'.

Figure 11:
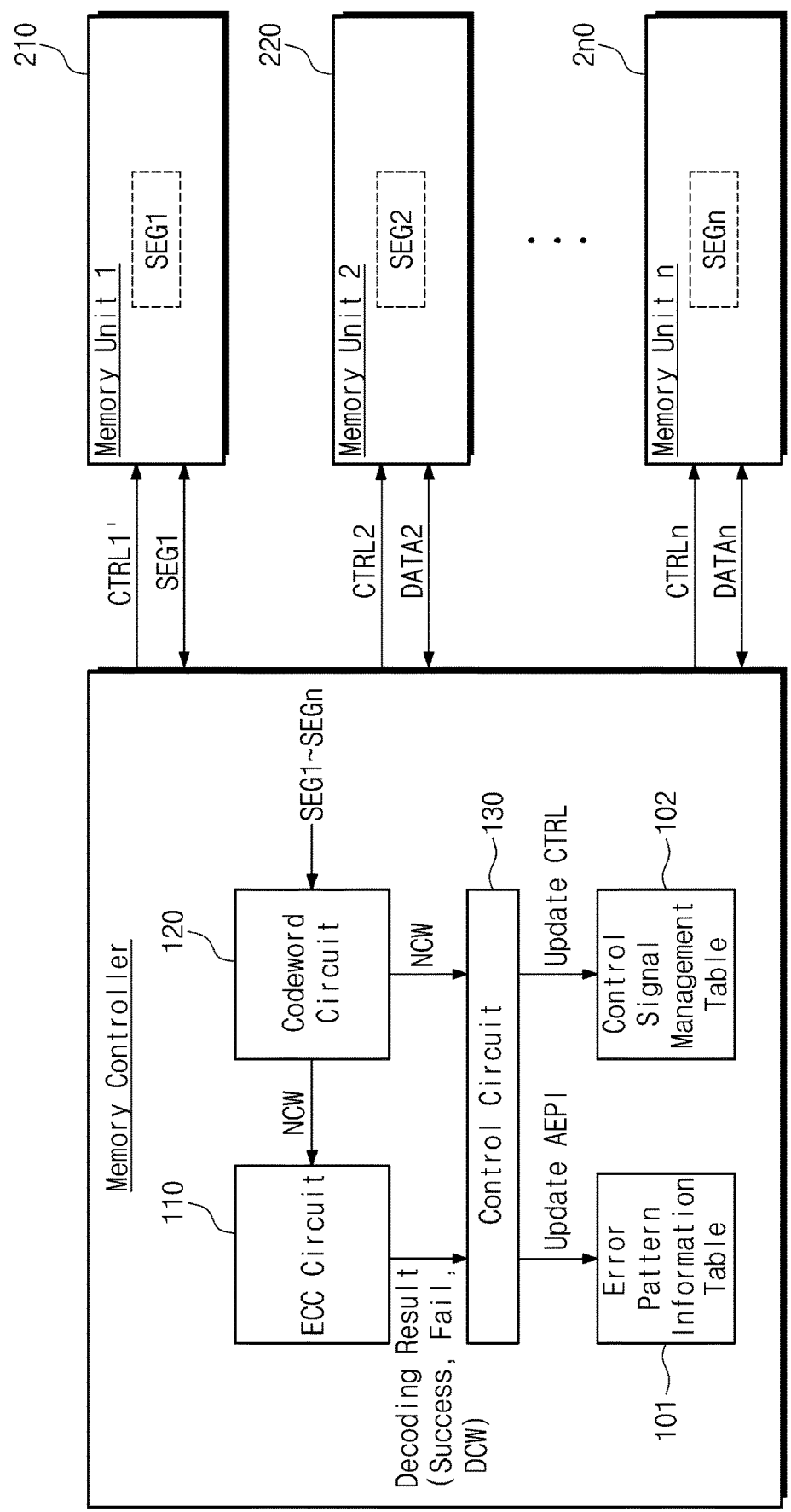
FIG. 11 illustrates a diagram of an exemplification in which a memory controller of FIG. 9 again performs decoding depending on a decoding failure.

FIG. 11 illustrates a diagram of an exemplification in which a memory controller of FIG. 9 again performs decoding depending on a decoding failure. Referring to FIG. 11, the codeword circuit 120 may generate a new output codeword NCW based on the first segment SEG1 again read from the first memory unit 210. The codeword circuit 120 may generate a new output codeword NCW based on the re-read first segment SEG1 and the second to n-th segments SEG2 to SEGn previously read.

The ECC circuit 110 may perform decoding on the new output codeword NCW and may output a decoding result. In the case where the decoding result indicates a success, the control circuit 130 may operate as described with reference to FIGS. 4 to 8. In an embodiment, the control circuit 130 may detect an error bit by comparing the decoded codeword DCW and the new output codeword NCW. The control circuit 130 may update the accumulated error pattern information AEPI of the error pattern information table 101 based on the detected error bit. The control circuit 130 may regulate a control signal based on the accumulated error pattern information AEPI, and may update the control signal management table 102 based on the regulated control signal. Alternatively, the control circuit 130 may refresh the segments SEG1 to SEGn stored in the memory units 210 to 2n0 based on the decoded codeword DCW. That is, the control circuit 130 may rewrite the segments SEG1 to SEGn from the decoded codeword DCW in which error bits are corrected.

In the case where the decoding result indicates failure, the control circuit 130 may determine that a read operation has failed.

As described above, in the case where the decoding result indicates failure, the control circuit 130 may regulate a control signal and may re-read a segment based on the regulated control signal. In this case, the number of error bits of the re-read segment may decrease. Accordingly, the probability that decoding of the new output codeword NCW generated based on the re-read segment succeeds may increase. Also, the control circuit 130 may not re-read all the segments SEG1 to SEGn stored in the memory units 210 to 2n0, but the control circuit 130 may however re-read only a segment stored in a memory unit corresponding to the regulated control signal. Accordingly, an increase of read latency may be minimized, and power consumption may decrease.

Figure 12:
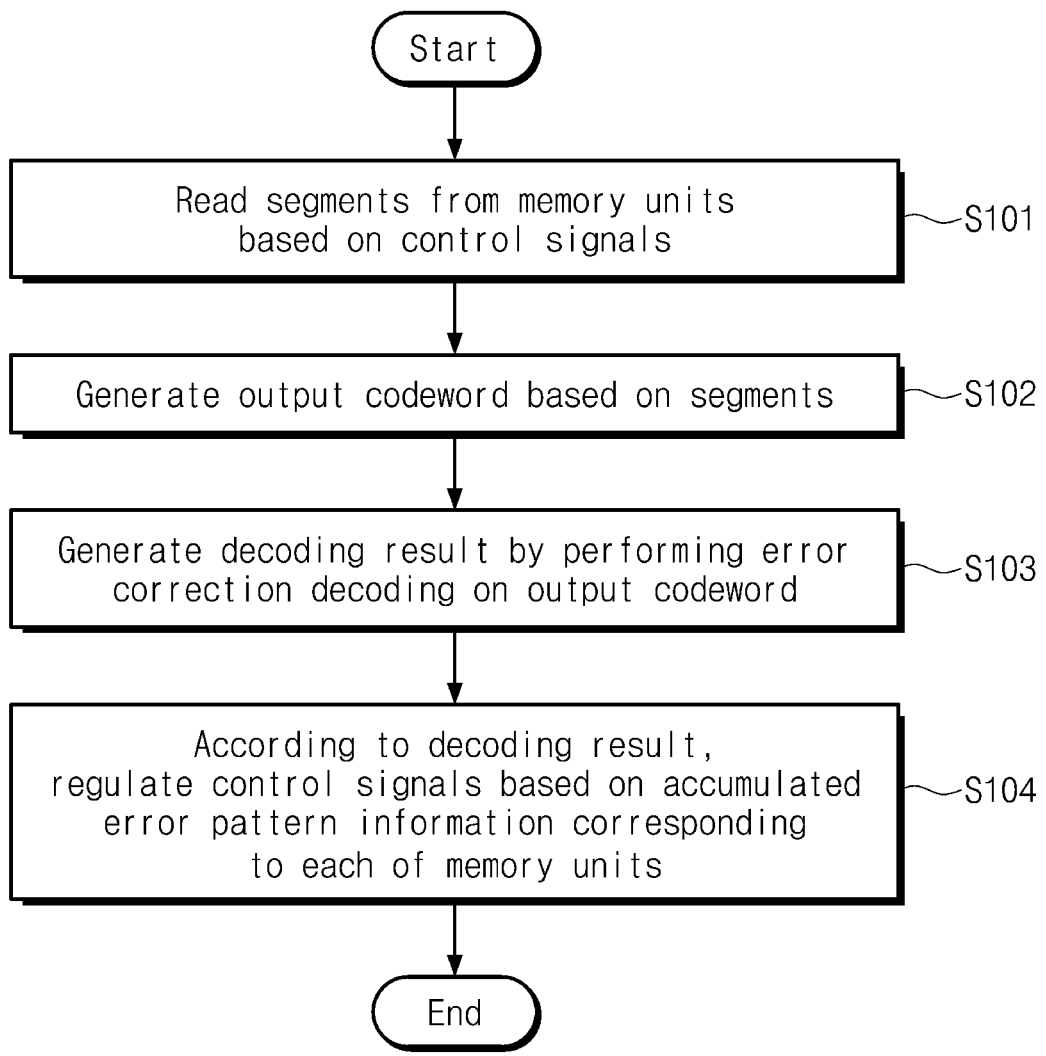
FIG. 12 illustrates a flowchart of an operation of a memory controller according to an embodiment of the inventive concepts.

FIG. 12 illustrates a flowchart of an operation of a memory controller according to an embodiment of the inventive concepts. Referring to FIGS. 3 and 12, in operation S101, the memory controller 100 receives (i.e., reads) the plurality of segments SEG1 to SEGn from the plurality of memory units 210 to 2n0 based on the plurality of control signals CTRL1 to CTRLn. In operation S102, the memory controller 100 generates the output codeword CW based on the plurality of segments SEG1 to SEGn. In operation S103, the memory controller 100 performs error correction decoding on the output codeword CW and generates a decoding result.

In operation S104, the memory controller 100 regulates the plurality of control signals CTRL1 to CTRLn based on the accumulated error pattern information AEPI corresponding to each of the plurality of memory units 210 to 2n0 depending on the decoding result. In an embodiment, the memory controller 100 may regulate at least one of the plurality of control signals CTRL1 to CTRLn based on at least one of a plurality of accumulated error pattern information AEPI corresponding to the plurality of memory units 210 to 2n0.

Figure 13:
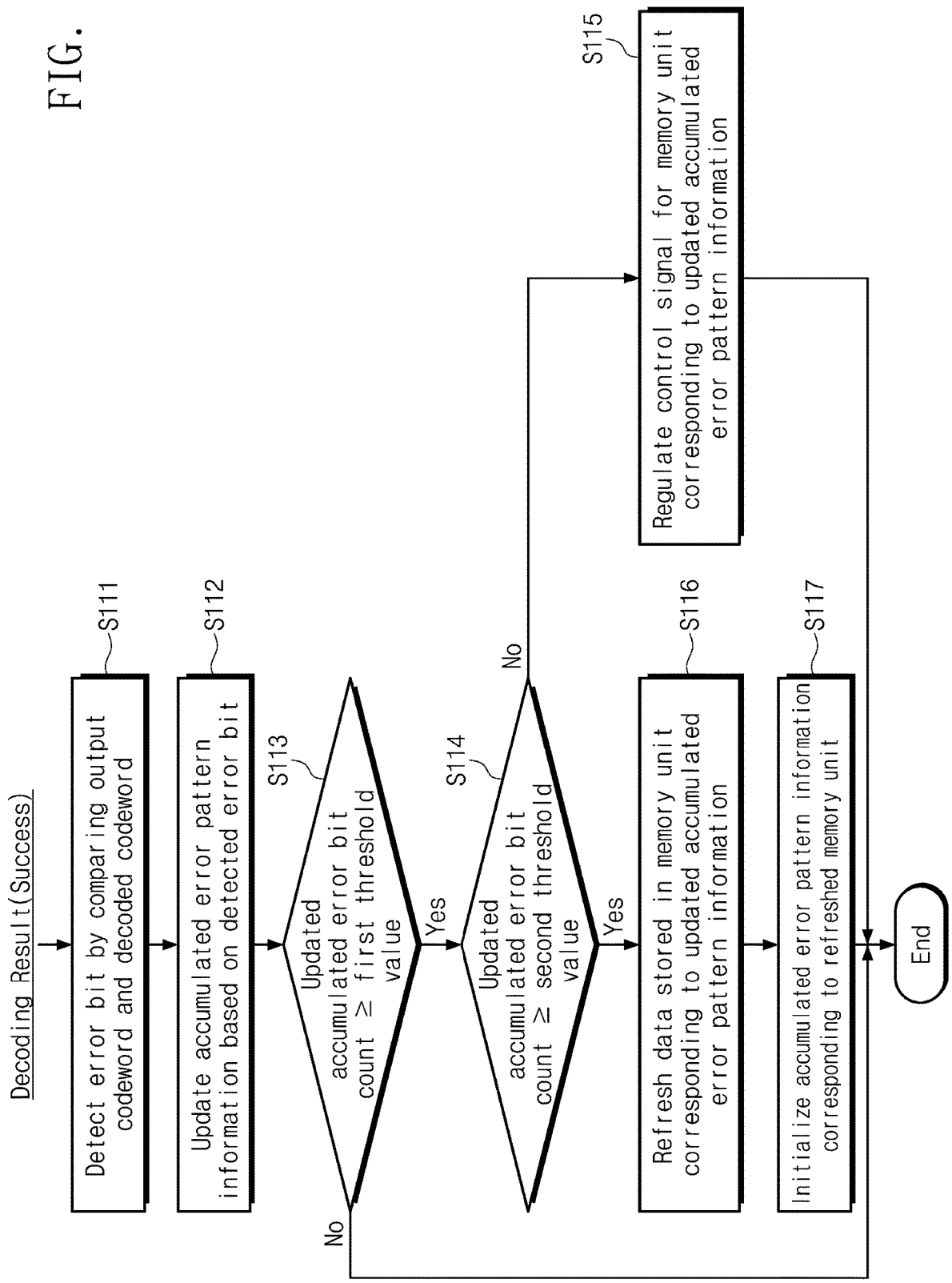
FIG. 13 illustrates a flowchart of an operation corresponding to a case where decoding by a memory controller succeeds, according to an embodiment of the inventive concepts.

FIG. 13 illustrates a flowchart of an operation corresponding to a case where decoding by a memory controller succeeds, according to an embodiment of the inventive concepts. Referring to FIGS. 4 and 13, in operation S111, the memory controller 100 detects an error bit by comparing the output codeword CW and the decoded codeword DCW. In operation S112, the memory controller 100 updates the accumulated error pattern information AEPI of the error pattern information table 101 based on the detected error bit.

In operation S113, the memory controller 100 determines whether the updated accumulated error bit count of the updated accumulated error pattern information AEPI is not smaller than a first threshold value. In the case where the updated accumulated error bit count is not smaller than the first threshold value (Yes in S113), in operation S114 the memory controller 100 determines whether the updated accumulated error bit count is not smaller than a second threshold value. In the case where the updated accumulated error bit count is smaller than the second threshold value (No in S114), in operation S115 the memory controller 100 regulates a control signal associated with a memory unit corresponding to the updated accumulated error pattern information AEPI.

In the case where the updated accumulated error bit count is not smaller than the second threshold value (Yes in S114), in operation S116 the memory controller 100 refreshes data stored in a memory unit corresponding to the updated accumulated error pattern information AEPI. That is, all data stored in the corresponding memory unit may be rewritten. In operation S117, the memory controller 100 initializes the accumulated error pattern information AEPI corresponding to the refreshed memory unit. For example, the accumulated error bit count corresponding to the refreshed memory unit may be initialized. In the case that the updated accumulated error bit count is smaller than the first threshold value (No in S113), the operation ends.

Figure 14:
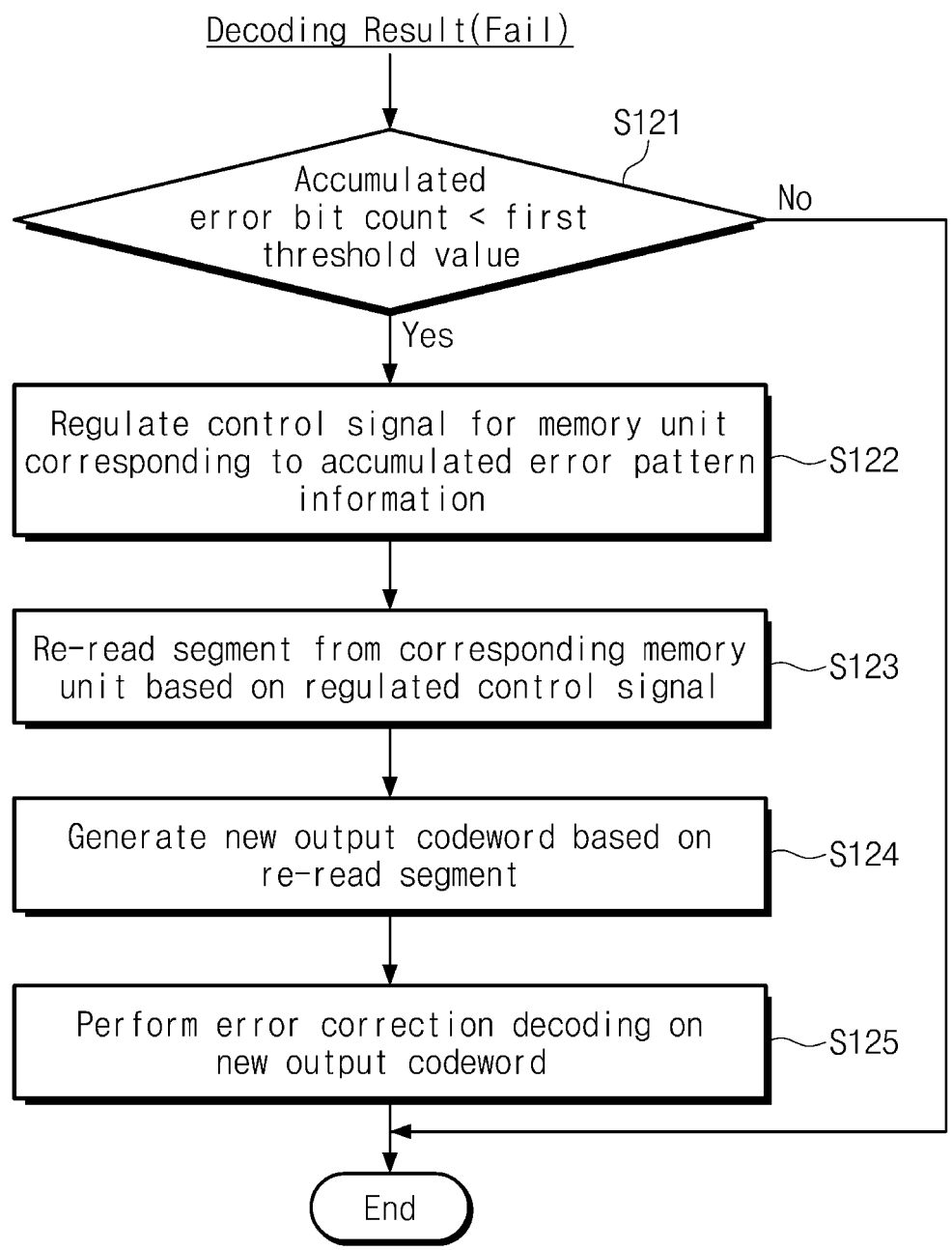
FIG. 14 illustrates a flowchart of an operation corresponding to a case where decoding by a memory controller fails, according to an embodiment of the inventive concepts.

FIG. 14 illustrates a flowchart of an operation corresponding to a case where decoding by a memory controller fails, according to an embodiment of the inventive concepts. Referring to FIGS. 9 and 14, in operation S121 the memory controller 100 determines whether the accumulated error bit count in the accumulated error pattern information AEPI corresponding to each of the memory units 210 to 2n0 is smaller than a first threshold value. In the case where the accumulated error bit count of a corresponding memory unit is smaller than the first threshold value (Yes in S121), in operation S122 the memory controller 100 regulates a control signal associated with the memory unit corresponding to the accumulated error pattern information AEPI. In operation S123, the memory controller 100 re-reads a segment from a relevant (i.e., the corresponding) memory unit based on the regulated control signal. In operation S124, the memory controller 100 generates a new output codeword NCW based on the re-read segment. In operation S125, the memory controller 100 performs error correction decoding on the new output codeword NCW. In the case that the accumulated error bit count corresponding to each memory unit is not smaller than the first threshold value (No in S121), the operation ends.

Figure 15:
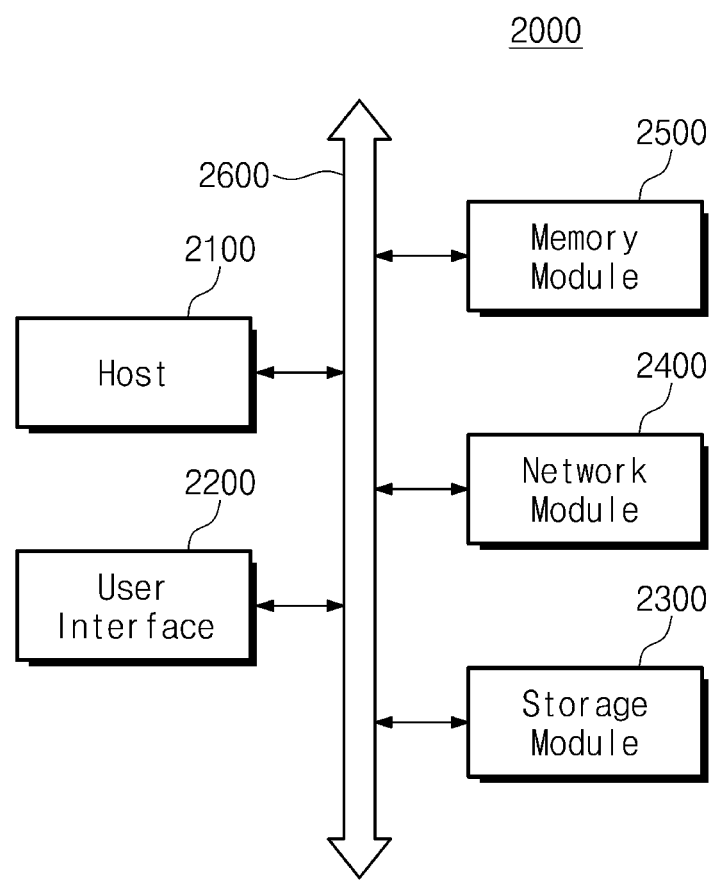
FIG. 15 illustrates a block diagram of an application of a memory system according to an embodiment of the inventive concepts.

FIG. 15 illustrates a block diagram of an application of a memory system according to an embodiment of the inventive concepts. Referring to FIG. 15, a computer system 2000 includes a host 2100, a user interface 2200, a storage module 2300, a network module 2400, a memory module 2500, and a system bus 2600.

The host 2100 may drive components and an operating system included in the computer system 2000. In an embodiment, the host 2100 may include for example controllers, interfaces, graphics engines, and/or the like for the purpose of controlling components of the computer system 2000. The host 2100 may be implemented with a system-on-chip (SoC) for example.

The user interface 2200 may include interfaces which input data or an instruction to the host 2100 or output data to an external device. In an embodiment, the user interface 2200 may include user input interfaces such as for example a keyboard, a keypad, buttons, a touch panel, a touch screen, a touch pad, a touch ball, a camera, a microphone, a gyroscope sensor, a vibration sensor, and a piezoelectric sensor, or the like. The user interface 2200 may further include interfaces such as a liquid crystal display (LCD), an organic light-emitting diode (OLED) display device, an active matrix OLED (AMOLED) display device, a light-emitting diode (LED), a speaker, and a motor, among other interfaces.

The storage module 2300 may store data. For example, the storage module 2300 may store data received from the host 2100. Alternatively, the storage module 2300 may transfer data stored therein to the host 2100. In an embodiment, the storage module 2300 may be implemented with a nonvolatile memory system such as for example electrically programmable read only memory (EPROM), electrically erasable programmable read only memory (EPROM), NAND flash memory, NOR flash memory, phase-change RAM (PRAM), resistive RAM (ReRAM), ferroelectric RAM (FeRAM), magnetic RAM (MRAM), or thyristor RAM (TRAM), or the like. The storage module 2300 may include a memory system according to the embodiments of the inventive concepts described with reference to FIGS. 1 to 14.

The network module 2400 may communicate with external devices. In an embodiment, the network module 2400 may support wireless communication such as code division multiple access (CDMA), global system for mobile communication (GSM), wideband CDMA (WCDMA), CDMA-2000, time division multiple access (TDMA), long term evolution (LTE™), worldwide interoperability for microwave access (Wimax), wireless LAN (WLAN), ultra wide band (UWB), Bluetooth, and wireless display (WI-DI).

The memory module 2500 may operate as a main memory, a working memory, a buffer memory, or a cache memory of the computer system 2000. The memory module 2500 may include a volatile memory system such as for example DRAM or SRAM, or a nonvolatile memory system such as for example NAND flash memory, NOR flash memory, PRAM, ReRAM, FeRAM, MRAM, or TRAM. The memory module 2500 may include a memory system according to the embodiments of the inventive concept described with reference to FIGS. 1 to 14.

The system bus 2600 may electrically connect the host 2100, the user interface 2200, the storage module 2300, the network module 2400, and the memory module 2500 to each other.

According to the inventive concepts, a memory controller and a memory system which may prevent failure of error correction performed on data may be provided.

Also, there may be provided a memory controller and a memory system which may increase the probability of error correction success and which may minimize power consumption in the case where error correction is again performed after the error correction failure.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. An operating method of a memory controller which individually controls a plurality of memory units, the method comprising:
reading, by the memory controller, segments from the plurality of memory units based on a plurality of control signals;
generating, by the memory controller, an output codeword based on the segments;
performing, by the memory controller, error correction decoding on the output codeword;
when a result of the error correction decoding indicates success, updating, by the memory controller, at least one of a plurality of accumulated error pattern information respectively corresponding to the plurality of memory units based on the result of the error correction decoding; and
when the result of the error correction decoding indicates failure, regulating, by the memory controller, at least one of the plurality of control signals based on at least another one of the plurality of accumulated error pattern information to provide at least one regulated control signal and re-reading at least one of the segments using a changed read voltage level based on the at least one regulated control signal,
wherein the updating of the at least one of the plurality of accumulated error pattern information comprises:
comparing the output codeword and a decoded codeword generated according to the error correction decoding to detect an error bit corresponding to a first memory unit of the plurality of memory units; and
updating first accumulated error pattern information from among the plurality of accumulated error pattern information that corresponds to the first memory unit based on the detected error bit,
wherein the method further comprises regulating, by the memory controller, a control signal from among the plurality of control signals that corresponds to the first memory unit, when an updated first accumulated error bit count of the updated first accumulated error pattern information is not smaller than a first threshold value and is smaller than a second threshold value, and
wherein, when the result of the error correction decoding indicates failure and a second accumulated error bit count of second accumulated error pattern information from among the plurality of accumulated error pattern information that corresponds to a second memory unit from among the plurality of memory units is smaller than the first threshold value, regulating by the memory controller a second control signal from among the plurality of control signals that corresponds to the second memory unit to provide a regulated second control signal as the at least one regulated control signal.

2. The method of claim 1, further comprising:
refreshing, by the memory controller, data stored in the first memory unit, when the updated first accumulated error bit count is not smaller than the second threshold value; and
initializing the updated first accumulated error pattern information.

3. The method of claim 1, further comprising:
re-reading, by the memory controller, one of the segments from the second memory unit based on the regulated second control signal that corresponds to the second memory unit;
generating a new output codeword based on the re-read segment; and
performing the error correction decoding on the new output codeword.

4. The method of claim 1, wherein each of the plurality of memory units comprises one of a memory device, a memory chip, a memory die, a memory bank, a memory block, and memory cells connected to one word line.

5. The method of claim 1, further comprising:
performing, by the memory controller, error correction encoding on data provided from a host to generate an input codeword to which an error correction code is added;
dividing, by the memory controller, the input codeword to generate the segments; and
storing, by the memory controller, the segments in the plurality of memory units based on the plurality of control signals.

6. A memory controller comprising:
a codeword circuit configured to generate an output codeword based on a first segment read from a first memory unit depending on a first control signal and a second segment read from a second memory unit depending on a second control signal;
an error correction code (ECC) circuit configured to perform error correction decoding on the output codeword; and
a control circuit configured to operate depending on a result of the error correction decoding,
wherein the control circuit is configured to regulate at least one of a first read voltage level of the first memory unit and a second read voltage level of the second memory unit based on at least one of first accumulated error pattern information corresponding to the first memory unit and second accumulated error pattern information corresponding to the second memory unit, and regulate at least one of the first control signal and the second control signal based on the regulated at least one of the first read voltage level and the second read voltage level,
wherein the first accumulated error pattern information includes first bit error pattern information indicating pattern information of a first bit error in which a first bit value read from the first memory unit is decoded to a first different bit value,
wherein the second accumulated error pattern information includes second bit error pattern information indicating pattern information of a second bit error in which a second bit value read from the second memory unit is decoded to a second different bit value, and
wherein the control circuit is configured to regulate the at least one of the first read voltage level and the second read voltage level based on at least one of the first bit error pattern information and the second bit error pattern information.

7. The memory controller of claim 6, wherein, when the result of the error correction decoding indicates success,
the ECC circuit is configured to generate a decoded codeword, and
the control circuit is further configured to
compare the output codeword and the decoded codeword to provide a comparison result, and when at least one error bit is detected from bits corresponding to the first segment based on the comparison result, update the first accumulated error pattern information based on the at least one error bit.

8. The memory controller of claim 7, wherein when an updated first accumulated error bit count of the updated first accumulated error pattern information is not smaller than a first threshold value and is smaller than a second threshold value, the control circuit is configured to regulate the first control signal.

9. The memory controller of claim 8, wherein when the updated first accumulated error bit count is not smaller than the second threshold value, the control circuit is configured to refresh data stored in the first memory unit and to initialize the updated first accumulated error pattern information.

10. The memory controller of claim 8, wherein when the result of the error correction decoding indicates failure and a first accumulated error bit count of the first accumulated error pattern information is smaller than the first threshold value, the control circuit is configured to regulate the first control signal.

11. The memory controller of claim 10, wherein when the result of the error correction decoding indicates failure,
the control circuit is further configured to re-read the first segment from the first memory unit based on the regulated first control signal,
the codeword circuit is further configured to generate a new output codeword based on the re-read first segment and the second segment, and
the ECC circuit is further configured to perform the error correction decoding on the new output codeword.

12. A memory system comprising:
a first memory unit configured to operate in response to a first control signal;
a second memory unit configured to operate in response to a second control signal; and
a memory controller configured to read a first segment from the first memory unit based on the first control signal and to read a second segment from the second memory unit based on the second control signal,
wherein the memory controller comprises
a codeword circuit configured to generate an output codeword based on the first segment and the second segment,
an error correction code (ECC) circuit configured to perform error correction decoding on the output codeword, and
a control circuit configured to operate depending on a result of the error correction decoding,
wherein the control circuit is configured to regulate at least one of the first control signal and the second control signal based on at least one of first accumulated error pattern information corresponding to the first memory unit and second accumulated error pattern information corresponding to the second memory unit,
wherein when the result of the error correction decoding indicates failure and a first accumulated error bit count of the first accumulated error pattern information is smaller than a first threshold value, the control circuit is configured to regulate the first control signal to provide a regulated first control signal, and
wherein when the result of the error correction decoding indicates failure and the first accumulated error bit count of the first accumulated error pattern information is smaller than the first threshold value, the control circuit is further configured to re-read the first segment based on the regulated first control signal.

13. The memory system of claim 12, wherein when the result of the error correction decoding indicates success,
the ECC circuit is configured to generate a decoded codeword, and
the control circuit is further configured to
compare the output codeword and the decoded codeword to provide a comparison result, and
when at least one error bit is detected from bits corresponding to the first segment based on the comparison result, update the first accumulated error pattern information based on the at least one error bit.

14. The memory system of claim 13, wherein when an updated first accumulated error bit count of the updated first accumulated error pattern information is not smaller than the first threshold value and is smaller than a second threshold value, the control circuit is further configured to regulate the first control signal.

* * * * *